US012557426B2

(12) United States Patent
Shen et al.

(10) Patent No.: US 12,557,426 B2
(45) Date of Patent: Feb. 17, 2026

(54) SLOT-DIE TYPE GAS DISTRIBUTION DEVICE FOR PHOTOVOLTAIC MANUFACTURING

(71) Applicant: CNBM RESEARCH INSTITUTE FOR ADVANCED GLASS MATERIALS GROUP CO.,LTD., Bengbu (CN)

(72) Inventors: Yilei Shen, Schwetzingen (DE); Nan Chen, Erlangen (DE); Thomas Dalibor, Herrsching Am Ammersee (DE)

(73) Assignee: CNBM RESEARCH INSTITUTE FOR ADVANCED GLASS MATERIALS GROUP CO., LTD., Anhui (CN)

( * ) Notice: Subject to any disclaimer, the term of this patent is extended or adjusted under 35 U.S.C. 154(b) by 0 days.

(21) Appl. No.: 18/943,037

(22) Filed: Nov. 11, 2024

(65) Prior Publication Data

US 2025/0072153 A1 Feb. 27, 2025

Related U.S. Application Data

(63) Continuation of application No. PCT/CN2023/131486, filed on Nov. 14, 2023.

(51) Int. Cl.

| | |
|---|---|
| ***C30B 25/14*** | (2006.01) |
| ***C23C 16/44*** | (2006.01) |
| ***C23C 16/455*** | (2006.01) |
| ***H10F 71/00*** | (2025.01) |

(52) U.S. Cl.

CPC ......... *H10F 71/00* (2025.01); *C23C 16/4412* (2013.01); *C23C 16/45504* (2013.01); *C23C 16/45561* (2013.01); *C23C 16/45578* (2013.01); *C23C 16/45582* (2013.01); *C23C 16/45585* (2013.01); *C30B 25/14* (2013.01)

(58) Field of Classification Search

None

See application file for complete search history.

(56) References Cited

U.S. PATENT DOCUMENTS 4,731,255 A * 3/1988 Maeda .................. C30B 25/105 427/583
4,909,914 A * 3/1990 Chiba ..................... C23C 14/22 239/81
4,911,102 A * 3/1990 Manabe .................. C30B 25/02 257/E33.045

(Continued)

FOREIGN PATENT DOCUMENTS

CN 101319309 A 12/2008
CN 110140224 A 8/2019

*Primary Examiner* — Karla A Moore

(57) ABSTRACT

A slot-die type gas distribution device for photovoltaic manufacturing is provided. The slot-die type gas distribution device includes a first gas distribution device (105) at a process chamber inlet (104) and a second gas distribution device (13) at a process chamber outlet (11). The first gas distribution device (105) is connected to the process chamber inlet (104) through a flat quadrangular first communication device (9), and the second gas distribution device (13) is connected to the process chamber outlet (11) through a flat quadrangular third communication device (12). The device effectively improves the gas distribution uniformity in the process chamber.

11 Claims, 33 Drawing Sheets

(56) References Cited

U.S. PATENT DOCUMENTS

| | | | | |
|---|---|---|---|---|
| 5,370,738 | A * | 12/1994 | Watanabe | C30B 25/14 118/725 |
| 5,405,446 | A * | 4/1995 | Nakajima | C23C 16/45504 118/725 |
| 5,421,288 | A * | 6/1995 | Ohta | C23C 16/4584 118/724 |
| 5,749,974 | A * | 5/1998 | Habuka | C30B 25/08 118/724 |
| 6,539,891 | B1 * | 4/2003 | Lee | C23C 16/45561 118/725 |
| 11,784,026 | B2 * | 10/2023 | Kim | C23C 16/452 118/723 R |
| 2001/0032588 | A1 * | 10/2001 | Harafuji | C23C 16/45504 118/715 |
| 2004/0007176 | A1 | 1/2004 | Janakiraman et al. | |
| 2006/0249077 | A1 * | 11/2006 | Kim | C23C 16/45519 118/723 MP |
| 2008/0305246 | A1 | 12/2008 | Choi et al. | |
| 2010/0255658 | A1 * | 10/2010 | Aggarwal | C23C 16/45504 118/728 |
| 2013/0014698 | A1 * | 1/2013 | Kools | C23C 16/45591 239/589 |
| 2015/0267299 | A1 * | 9/2015 | Hawkins | C23C 16/45523 427/255.28 |
| 2015/0376793 | A1 | 12/2015 | Carlson | |

* cited by examiner

Prior Art
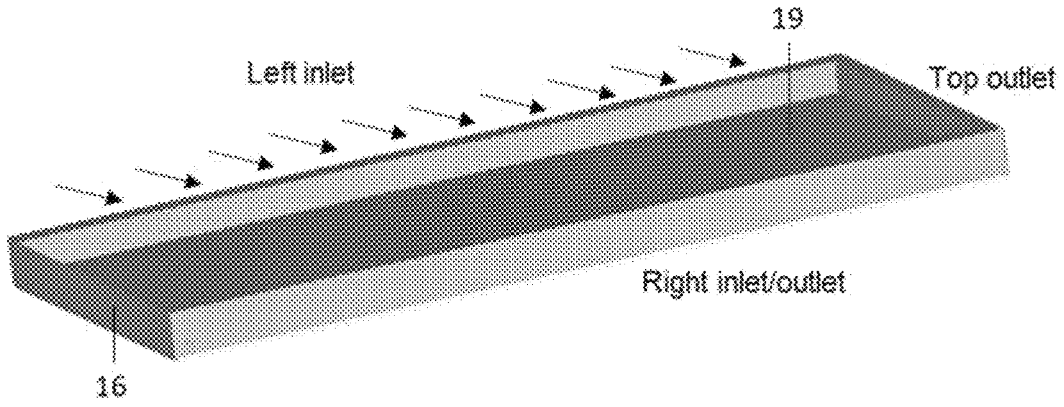
FIG.2 a）

Prior Art
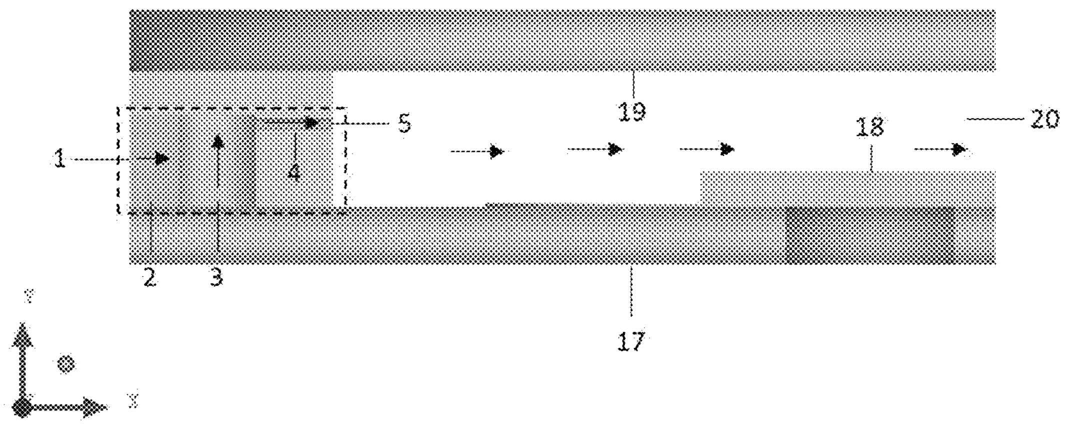
FIG.2 b）

Prior Art

Prior Art

SLOT-DIE TYPE GAS DISTRIBUTION DEVICE FOR PHOTOVOLTAIC MANUFACTURING

CROSS-REFERENCE TO RELATED APPLICATIONS

This application is a continuation of International Patent Application No. PCT/CN2023/131486, filed on Nov. 14, 2023. The content of the aforementioned applications, including any intervening amendments thereto, are incorporated herein by reference.

TECHNICAL FIELD

The present invention relates to the field of photovoltaic preparation technology, and in particular, to a slot-die type gas distribution device for photovoltaic manufacturing.

BACKGROUND

During photovoltaic manufacturing, in order to passivate or form certain layers, there are some key process steps, including gas distribution and high-temperature heating. In FIG. 1, a general schematic diagram of these processes is illustrated.

These semi-manufactured solar devices (including a substrate and a stack of certain photovoltaic layers: a top layer and an underlayer stack) to be processed here may be Si-based or thin-film photovoltaic technology. It should be noted that the gas mentioned here may be reaction gas or gas mixture (reaction gas and carrier gas). In the case of Si-PVs, $H_2S$ (reaction gas) is used to sulfurize/passivate the n-type Si surface, so as to increase the charge carrier lifetime at about 600° C.; or $H_2$ (reaction gas) and $N_2$ (carrier gas) are used to hydrogenate/passivate the SiOx: $Al_2O_3$ contact for P-type or n-type Si-PVs, so as to increase the charge carrier lifetime at about 400° C.; or $B_2H_6$ and $PH_3$ (both reaction gases) are used to dope the n- or p-Si layers for TOPCon cells in the LPCVD (low-pressure chemical vapor deposition) process. In the case of thin-film PVs, $H_2Se$, $CI_2$ or HCI gas may be used to passivate CdTe grain boundaries at 400° C. to 450° C. to reduce defects and increase the efficiency of power conversion; or $H_2S/H_2Se$ may be used to sulfurize/selenize/passivate the CIGS absorber layer at 300° C. to 400° C. during the PDT (post-deposition treatment) process; or $H_2S$ or $H_2Se$ may be used to sulfurize/selenize the CIGS precursor layer to form a CIGS absorber at 400° C. to 600° C. during the RTP (rapid thermal processing). Usually, these processes which use gas under a high-temperature heating condition are carried out in a process chamber with very limited dimensions, so as to reduce heat and required gas amount, so that energy and other costs can be saved. For such a horizontally flat process box, it is not easy to make the gas distribution uniform. In a large process box for mass production, it is easy to cause a local concentration gradient by introducing gas into the chamber. In addition, although the gas is preheated to 100° C. to 150° C. before the inlet, there is still a temperature deviation between the gas and the continuously heated process chamber, e.g. up to 400° C. to 600° C. This will also lead to a local temperature gradient in the process box. Since the process reaction kinetics (sulfurization, selenization, chlorination, hydrogenation, boron or phosphorus doping, etc.) is strongly influenced by the concentration and temperature of the reactant (reaction gas in this case), accurately controlled uniform gas distribution in the process box is vital to ensure process reproducibility and uniformity as well as the good performance of mass-produced PV devices.

However, in reality, in the aforementioned process, the chemical reaction on the top layer (see FIG. 1) may be very complicated and fast. Therefore, an improper process box design can easily lead to nonuniform distribution of gas (reaction gas or a gas mixture of reaction gas and carrier gas) and gas temperature, which further leads to uneven surface morphology/roughness, element static or photoelectric properties of final photovoltaic devices. An example of a selenization/sulfurization process box for certain photovoltaic manufacturing is shown in FIG. 2, which illustrates the direct correlation between a process box design with an inappropriate standard and the nonuniform gas distribution in the process box. In addition to the selenization/sulfurization process, the inappropriate process box design will also lead to nonuniform gas distribution for chlorification, hydrogenation, boron or phosphor doping or so on in PV manufacturing.

In FIG. 2*a*) and FIG. 2*b*), a standard design of the existing selenization/sulfurization process box 16 is shown. This type of process box 16 usually consists of a body frame (high temperature-resistant material) with a fixed bottom plate and a non-fixed cover plate (gravitational covering mechanism), whereby gas flows through a substrate 18 (photovoltaic layer stack at the top) and reacts with its surface. It should be noted that both the cover plate 19 and the bottom plate 17 are made of an infrared transparent or emitting material. The heating of such a selenization/sulfurization process box 16 is implemented by bilateral thermal radiation of the cover plate 19 and the bottom plate 17. Since the bottom plate 17 is fixed and the cover plate 19 is not, when the process chamber 20 is filled up with gas, the gas can exist through the top short-edge guide side (the gap between the process box frame and the cover plate 19), which is denoted as a top gas outlet. In the present embodiment, gas inlets/outlets are designed on both long-edge guide sides of the frame. In practice, there are two methods: (1) gas is injected into the process chamber 20 through the left gas inlet and comes out through the right gas outlet; (2) gas is injected into the process chamber 20 through the left and right gas inlets, and the top short-edge front side is then taken as a gas outlet through the overfilling of the chamber 20. For such a narrow gap of the process chamber (height—width/length—ratio exceeding one magnitude), it is not easy to distribute the gas uniformly in it because of the large pressure drop along the process chamber.

A standard design of the left inlet portion for the gas distribution in the existing selenization/sulfurization process box is shown in FIG. 3*a*) and FIG. 3*b*). The arrow in FIG. 3*a*) and FIG. 3*b*) should indicate the direction of gas flow in the passage before entering the process chamber 20. The gas is first introduced into a gas inlet tube inlet 1 and then passes through a gas inlet tube 2. The gas flow will be further distributed along a gas manifold 3, flow into a plurality of tubes 4, and finally leave the left inlet portion from gas orifices 5 to enter the process chamber 20. Generally, the gas inlet tube inlet 1 is located on the same horizontal plane as the gas inlet tube 2 and the gas manifold 3. It should be noted that the rows of gas orifices 5 on the two long-edge guide sides are not symmetrically positioned. After leaving the left inlet portion, the gas enters the process chamber 20 and reacts with a photovoltaic layer stack on a substrate 18.

It should be noted that the size of the gas outlet portion is designed to be in an inverted mirroring relationship with that of the gas inlet portion.

FIG. 4*a*) shows gas streamlines in the process chamber 20 based on numerical simulation, while FIG. 4*b*) shows an optically scanned picture of the top layer of the related photovoltaic layer stack after selenization/sulfurization using the same process conditions for comparison. For simulation settings, a certain flow of gas is applied into the process box, with 60% at the left inlet and 40% at the right inlet. Therefore, the top of the process box is arranged as a gas outlet, and the other boundaries are arranged as normal walls. All these should reflect the actual selenization/sulfurization production conditions to some extent. A photovoltaic panel is highlighted in the dashed box in FIG. 4*a*). Regarding the gas streamline distribution shown here, many finger-shaped gas jets (brighter areas) are observed from the long-edge guide sides. Interestingly, most of them are highly associated with the positions of the gas orifices 5. Some of these gas jets form a large vortex. Finally, the flow of gas flows along a sine line (in the middle) to the gas outlet at the top short-edge front side. It can be seen from the comparison between FIG. 4*a*) and FIG. 4*b*) that there is a strong correlation between the simulated gas flow and the influence of selenization/sulfurization on the photovoltaic layer surface according to the scanned picture. Thus, the simulation may be verified in some way. It is assumed that the dark areas of the photovoltaic layer (FIG. 4*b*)) represent higher surface roughness, and the bright areas (finger-shaped gas jets) are less rough because the smooth surface reflects more light. The process chamber 20 is usually preheated by IR emitters before gas injection. Before entering the process chamber, the typical "cold" temperature of the gas is 100° C. to 150° C. Therefore, the nonuniform injection of the cold gas may have an impact on the top layer of the related photovoltaic layer stack, and as a result, there are small crystalline grains on part of the layer surface due to little thermal energy during growth by selenization. This means that under optical scanning, the surface of the top layer of the related photovoltaic layer stack can appear smooth and brighter in the gas injection area of the standard process box (see FIG. 4*a*) and FIG. 4*b*)). In addition, the dark areas represent higher temperatures, which may produce more defects in part of the device, causing a decrease in the efficiency of power conversion.

Nonuniform gas distribution will not only affect the performance of photovoltaic devices, but also affect the optical appearance of final photovoltaic products, such as fingers and vortexes. They are not suitable for BIPV facade applications. These panels have to be scrapped, so that the output can drop and the cost/price of products can rise.

Therefore, it is necessary to improve gas distribution in the related process box, so as to obtain better electrical and aesthetic properties of photovoltaic modules.

In the prior art, a method is designed to solve the problem of nonuniform gas distribution in a process box by using transfer tubes 4 with large-diameter or enlarged orifices. For comparison with the above, FIG. 5*a*), FIG. 5*b*) and FIG. 5*c*) show a standard design and two modified designs of the gas inlet section of a process box, respectively. As shown in FIG. 5*b*) and FIG. 5*c*), a transfer tube 4 is composed of two portions: a left half portion, adopting the same tube design as the standard design (FIG. 3*b*) and (FIG. 5*a*); and a right half portion, adopting a bowl-shaped hole 10 extension, thus expanding the gas injection from an gas orifice 5 to a process chamber 20. The tubes in FIG. 5(*b*) and FIG. 5(*c*) keep different diameters.

It should be noted that the gas outlet section of the process box is designed to be in an inverted mirroring relationship with the gas inlet section of the process box.

FIG. 6 *a*) and FIG. 6*b*) shows gas streamlines of the two improved designs of FIG. 5*b*) and FIG. 5*c*), with the gas jetting out from the left inlet and leaving the area from the right outlets. For stimulation settings, the top and other boundaries of the process box are arranged as normal walls, i.e. no gas outlets. The other boundary conditions remain the same as in FIG. 4*a*) and FIG. 4*b*). It can be seen that on the right side, the gas streamlines become more parallelly oriented towards the right gas outlets. The modified designs seem to improve the gas distribution in the process box to some extent. However, there still exist finger-shaped gas jets and vortexes, and as a result, nonuniform gas flow will lead to the nonuniform distribution of gas and temperature field. Therefore, it will affect the device performance and optical appearance of final photovoltaic products.

In a word, the improved process box with the expanded gas orifices can slightly improve the gas distribution, but cannot completely solve the problem. There is still a need to improve the design of the process box, so as to achieve more uniform gas distribution.

SUMMARY

In view of the problems existing in the prior art, the present invention provides a slot-die type gas distribution device for photovoltaic manufacturing, which effectively improves the uniformity of gas distribution in the process chamber.

The slot-die type gas distribution device for photovoltaic manufacturing according to the present invention comprises a first gas distribution device located at a process chamber inlet, wherein the first gas distribution device is provided with a first inlet and a first outlet, with the first inlet being connected to a gas inlet tube and the first outlet being connected to the process chamber inlet;

the first outlet is communicated with the process chamber inlet through a first communication device, which is a flat quadrangular hollow box, with two opposite sides of the hollow box being uncovered and used as an inlet and an outlet respectively, and the shapes and sizes of the first outlet, a first communication device inlet, a first communication device outlet and the process chamber inlet are the same; wherein with regard to the hollow box, the length is greater than the width, the width is greater than the height, and the two uncovered sides of the hollow box are parallel to the height direction of the hollow box, that is, a hollow box inlet is long and narrow.

It can be understood that gas passes through inlet of the gas inlet tube 、the gas inlet tube 、outlet of the gas inlet tube, the first gas distribution device inlet (i.e. the first inlet), the first gas distribution device, the first gas distribution device outlet (i.e. the first outlet), the first communication device inlet (i.e. the hollow box inlet), the first communication device, the first communication device outlet (i.e. a hollow box outlet) and the process chamber inlet in sequence, and is then transmitted into the process chamber.

In the embodiments of the present application, "with regard to the hollow box, the length is greater than the width, the width is greater than the height, and the two uncovered sides of the hollow box are parallel to the height direction of the hollow box" means that the length of the hollow box inlet/outlet is equal to the length of the hollow box, and the width of the hollow box inlet/outlet is equal to the height of the hollow box, that is, the hollow box inlet is long and narrow. Further, since "the shapes and sizes of the first outlet, the first communication device inlet, the first communication device outlet and the process chamber inlet are the same" means that the first outlet, the first communication device inlet, the first communication device outlet and the process chamber inlet are all long and narrow, with the shapes and sizes being the same as those of the uncovered sides of the hollow box.

In the embodiments of the present application, the first outlet, the first communication device inlet, the first communication device outlet and the process chamber inlet are all long and narrow, and the sizes and shapes are consistent, so that the uniformity of gas distribution in the process chamber is improved.

In some preferred embodiments, the ratio of the length, width and height of the flat quadrangular hollow box is between 5000:20:1 and 20000:100:1.

In some preferred embodiments, the first gas distribution device comprises a first gas distribution tube, the first inlet is arranged at the top of the first gas distribution tube, so that the flow direction of the gas passing through the first inlet is perpendicular to the bottom surface of the first gas distribution tube, and the top of the first gas distribution tube is the highest position of the first gas distribution tube from the ground; and the position of the first outlet is lower than that of the first inlet.

In the embodiments of the present application, the first inlet is arranged at the top of the first gas distribution tube, so that the flow direction of the gas passing through the first inlet is perpendicular to the bottom surface of the first gas distribution tube, and thereby, after flowing into the first gas distribution tube from the top, the gas flows to the bottom surface of the first gas distribution tube and then rises along the side connected with the bottom surface until the gas flows out from the first outlet. "The position of the first outlet is lower than that of the first inlet" means that "the height of the first outlet from the ground is lower than that of the first inlet from the ground".

In some preferred embodiments, the first inlet is arranged at the center of the top of the first gas distribution tube.

In the embodiments of the present application, since the first inlet is arranged at the center of the top of the first gas distribution tube, the gas flows into the middle of the first gas distribution tube from the first inlet and is then redistributed, so that the gas is distributed in the whole first gas distribution tube, increasing the uniformity of the gas in the first gas distribution tube.

In some preferred embodiments, the long and narrow first outlet is arranged along the length direction of the first gas distribution tube and has a length equal to that of the first gas distribution tube, that is, the length of the first gas distribution tube is equal to that of the first communication device.

In the embodiments of the present application, since the first outlet, the first communication device inlet, the first communication device outlet and the process chamber inlet are all long and narrow and the lengths of the first outlet, the first communication device inlet, the first communication device outlet and the process chamber inlet are equal to that of the first gas distribution tube (that is, the length of the first gas distribution tube is equal to that of the first communication device (hollow box)), after being uniformly distributed in the first gas distribution tube, the gas flows out through the first outlet with the same length as the first gas distribution tube, and the area and shape of the flow section of the gas flow always remain the same in the whole process of the gas flowing from the first gas distribution device to the first communication device (i.e. the hollow box) and then to the process chamber inlet, thus further increasing the uniformity of distribution of the gas reaching the process chamber.

In some preferred embodiments, the height direction of the hollow box is perpendicular to the ground, so that the heights of the hollow box inlet and the hollow box outlet from the ground are equal, that is, the heights of the first outlet, the first communication device inlet, the first communication device outlet and the process chamber inlet from the ground are equal.

In the embodiments of the present application, "the height direction of the first communication device (i.e. the hollow box) is perpendicular to the ground" means "the plane formed by the length and width of the first communication device (i.e. the hollow box) is parallel to the ground", that is, the heights of the first outlet, the first communication device inlet, the first communication device outlet and the process chamber inlet from the ground are equal, so that the height of the flow section of the gas flow always remains the same during the transmission of the gas from the gas inlet tube to the process chamber, increasing the stability of gas distribution during flowing.

In a word, since the heights (i.e. heights from the ground), sizes and shapes of the first outlet, the first communication device inlet, the first communication device outlet and the process chamber inlet are the same, the area, shape and height of the flow section of the gas flow always remain the same when the gas is transmitted through the first outlet, the first communication device and the process chamber inlet before entering the process chamber and after being uniformly distributed through the first gas distribution tube, thus effectively ensuring the uniformity of distribution of the gas entering the process chamber.

In some preferred embodiments, the first gas distribution device comprises m (m is greater than or equal to 2) first gas distribution tubes, which are communicated in sequence, and each two adjacent first gas distribution tubes are communicated through a second communication device, so as to implement a gas distribution processes multiple times, and the structure of the second communication device is the same as that of the first communication device;

the first inlet is arranged on the first gas distribution tube at the starting end, and the first outlet is arranged on the first gas distribution tube at the tail end.

It can be understood that "the second communication device is structurally the same as the first communication device" can be understood as "the second communication device is a replica of the first communication device", and in addition, it has been described above that "the height direction of the first communication device (i.e. the hollow box) is perpendicular to the ground". Here, it should be noted that the second communication device is the same as the first communication device, that is, the height direction of the second communication device is perpendicular to the ground, that is, the heights of the hollow box inlet and hollow box outlet of the second communication device from the ground are equal. It can be understood that since each two adjacent first gas distribution tubes are communicated with each other through the second communication device, the first gas distribution tubes are provided with gas flow orifices with the same height (height from the ground), size and shape as the second communication device inlet/outlet at the joints between the first gas distribution tubes and the second communication device.

In the embodiments of the present application, since the plurality of first gas distribution tubes are communicated in sequence, the uniform gas distribution process can be implemented multiple times, thus increasing the uniformity of the gas entering the process chamber. It can be understood that since the first inlet is arranged on the top surface of the first gas distribution tube at the starting end, the inlet of the first gas distribution tube at the starting end is the first inlet, and the outlet of the first gas distribution tube at the starting end is the aforementioned gas flow hole; besides the first gas distribution tube at the starting end, each of the other first gas distribution tubes is provided with two aforementioned gas flow orifices (one is used as a gas inlet, and the other is used as a gas outlet); and the gas outlet of the first gas distribution tube at the tail end is the first outlet of the first gas distribution device. It can be understood that the heights (heights from the ground), sizes and shapes of all the gas flow orifices are equal to those of the first outlet, the second communication device inlet (i.e. the hollow box inlet), the second communication device outlet (i.e. the hollow box outlet) and the process chamber inlet mentioned above, so that the area, shape and height of the flow section of the gas flow always remain the same when the gas is uniformly distributed multiple times through the first gas distribution tubes and transmitted through the second communication device, the first outlet, the first communication device and the process chamber inlet before entering the process chamber.

In some preferred embodiments, the first gas distribution tube is semicircular or tetragonal.

In some preferred embodiments, when the first gas distribution tube is semicircular,

- the rectangular plane of the semicircular tube is located beneath the curved surface of the semicircular tube, and is parallel to the ground;
- the first inlet is arranged on the curved surface of the semicircular tube, and the height of the first inlet from the rectangular plane of the semicircular tube is the radius of the semicircular tube. This design makes the flow direction of the gas passing through the first inlet perpendicular to the rectangular plane of the semicircular tube, and "the height of the first inlet from the rectangular plane of the semicircular tube is the radius of the semicircular tube" means that the gas flows in from the highest position of the semicircular tube from the ground, and at the same time, the gas flows out from the lower first outlet after being uniformly distributed in the semicircular tubes.

This design enables the gas to pass through the first inlet in a direction perpendicular to the rectangular plane of the semicircular tube, drop to the rectangular plane of the semicircular tube below and rise along the curved surface of the semicircular tube, thus realizing the distribution of the gas in the cylindrical tube.

Since the rectangular plane of the semicircular tube is located beneath the curved surface of the semicircular tube and is parallel to the ground, the first gas distribution tube is stable and not easy to vibrate.

In some preferred embodiments, the first inlet is arranged at the center of the curved surface of the semicircular tube.

In the embodiments of the present application, the gas flows into the middle of the first gas distribution tube from the first inlet, and is then redistributed, and the gas simultaneously flows and diffuses in the semi-circular section direction and tube length direction of the semicircular tube, so that the gas is distributed in the whole semicircular tube, thus increasing the uniformity of the gas in the semicircular tube.

In some preferred embodiments, the first outlet is arranged on the curved surface of the semicircular tube, the height of the first outlet from the rectangular plane of the semicircular tube is less than the radius of the semicircular tube, the distance between two semi-circular planes of the semicircular tube is the length of the semicircular tube, and the first outlet is arranged along the length direction of the semicircular tube.

In the embodiments of the present application, the height of the first outlet from the ground is less than that of the first inlet. It can be known from the above that "the first outlet, the first communication device inlet, the first communication device outlet and the process chamber inlet are all long and narrow, with the shapes and sizes being the same as those of the uncovered sides of the hollow box". In the embodiments of the present application, the length of the first outlet is equal to that of the semicircular tube, that is, the length of the semicircular tube is equal to that of the first communication device (i.e. the hollow box).

In some preferred embodiments, the plurality of first gas distribution tubes have the same size.

In some preferred embodiments, the sizes of the plurality of the first gas distribution tubes are different.

In some preferred embodiments, the slot-die type gas distribution device further comprises a second gas distribution device located at a process chamber outlet, wherein the second gas distribution device is provided with a second inlet and a second outlet, the process chamber outlet is connected to the second inlet, and the second outlet is connected to a gas outlet tube; and

- the process chamber outlet and the second inlet are communicated with each other through a third communication device, which has the same structure as the first communication device.

In the embodiments of the present application, the slot-die type gas distribution device further comprises a second gas distribution device located at the process chamber outlet, wherein the design of the second gas distribution device is similar to that of the aforementioned first gas distribution device; and

- specifically, after a photovoltaic device is processed in the process chamber, the gas flows out from the process chamber outlet and flows to the second gas distribution device through the third communication device.

It can be understood that the third communication device is structurally the same as the first communication device, and it can be understood that the third communication device is a replica of the first communication device. It has been described above that the two opposite sides of the hollow box as the third communication device parallel to the height direction are uncovered to serve as the inlet and outlet of the third communication device, that is, the process chamber outlet, the hollow box inlet/outlet of the third communication device and the second inlet are all long and narrow, with the shapes and sizes being the same as those of the uncovered sides of the hollow box; that is, the lengths of the process chamber outlet, the hollow box inlet/outlet of the third communication device and the second inlet are equal to that of the hollow box, and the widths of the process chamber outlet, the hollow box inlet/outlet of the third communication device and the second inlet are equal to that of the hollow box.

The gas flowing out of the process chamber outlet sequentially flows through the inlet of the third communication device, the third communication device, the outlet of the third communication device, the second inlet, the second gas distribution device, the second outlet and the gas outlet tube; and the area and shape of the gas flow section of the gas flowing out of the process chamber outlet remain the same in the whole process of flowing.

In addition, it has been described above that "the height direction of the first communication device (i.e. the hollow box) is perpendicular to the ground", and it should be noted here that the height direction of the third communication device is also perpendicular to the ground, that is, the heights of the hollow box inlet and hollow box outlet of the third communication device from the ground are equal. It can be known from the above that the heights (heights from the ground), sizes and shapes of the process chamber outlet, a third communication device inlet, a third communication device outlet and the second inlet are the same, that is, the height of the gas flow section of the gas flowing out of the process chamber outlet remains the same in the whole process of flowing.

In some preferred embodiments, the second gas distribution device comprises a second gas distribution tube,

- the second outlet is arranged at the top of the second gas distribution tube, so that the flow direction of the gas flowing out of the second outlet is perpendicular to the bottom surface of the second gas distribution tube, the position of the second inlet is lower than that of the second outlet, and the top of the second gas distribution tube is the highest position of the second gas distribution tube from the ground; and
- the long and narrow second inlet is arranged along the length direction of the second gas distribution tube and has a length equal to that of the second gas distribution tube, that is, the length of the second gas distribution tube is equal to that of the third communication device.

In the embodiments of the present application, the second gas distribution device comprises a second gas distribution tube, the second inlet is arranged on the gas distribution tube, and the position of the second inlet is lower than that of the second outlet; and the second outlet is arranged at the top of the gas distribution tube, so that the gas in the process chamber can flow through the second inlet at the lower position to enter the second gas distribution tube and is uniformly distributed in the second gas distribution tube.

It can be understood that the second gas distribution tube has the same function as the aforementioned first gas distribution tube, that is, both of them are used for gas redistribution. Here, first and second are only intended to distinguish whether the first gas distribution tube is a device at the process chamber inlet or the second gas distribution tube is a device at the process chamber outlet. The shape and size of the second gas distribution tube can be the same as or different from those of the first gas distribution tube.

It can be understood that the position and structure of the first inlet are the same as those of the second outlet, the position and structure of the first outlet are the same as those of the second inlet, and further, the heights (i.e. heights from the ground), sizes and shapes of the process chamber outlet, the third communication device inlet/outlet (i.e. the hollow box inlet/outlet) and the second inlet are the same.

"The long and narrow second inlet is arranged along the length direction of the second gas distribution tube and has a length equal to that of the second gas distribution tube" means that the lengths of the process chamber outlet, the hollow box inlet, the hollow box outlet and the second inlet are all equal to that of the gas distribution tube, and further, the length of the gas distribution tube of the second gas distribution device is equal to that of the hollow box as the third communication device.

In some preferred embodiments, the height of the second inlet is greater than that of the first outlet. It should be noted that since it has been described above that the heights (i.e. heights from the ground) of the first outlet, the first communication device inlet, the first communication device outlet and the process chamber inlet are equal and that the heights (i.e. heights from the ground) of the process chamber outlet, the third communication device inlet/outlet (i.e. the hollow box inlet/outlet) and the second inlet are equal, "the height of the second inlet is greater than that of the first outlet" means that the height of the process chamber inlet is greater than that of the process chamber outlet.

In some preferred embodiments, the second gas distribution device comprises a second gas distribution tube, which is semicircular or tetragonal.

In some preferred embodiments, when the second gas distribution tube is semicircular,

- the rectangular plane of the semicircular tube of the second gas distribution tube is located beneath the curved surface of the semicircular tube, and the rectangular plane of the semicircular tube of the second gas distribution device is parallel to the ground;
- the second inlet is arranged on the curved surface of the semicircular tube, and the height of the second inlet from the rectangular plane of the semicircular tube is less than the radius of the semicircular tube;
- the second outlet is arranged on the curved surface of the semicircular tube, and the height of the second outlet from the rectangular plane of the semicircular tube is the radius of the semicircular tube.

That is, the second outlet is arranged at the highest point of the curved surface of the semicircular tube, and the position of the second outlet is higher than that of the second inlet.

In some preferred embodiments, the gas inlet tube and the gas outlet tube are bent tubes. In the embodiments of the present application, each of the gas inlet tube and the gas outlet tube is composed of two connected tubes with different flow directions, and further, the flow directions of the two tubes are arranged at a right angle.

It should be noted that the size designs of both the first gas distribution tube and the second gas distribution tube mentioned above in the present invention can be adjusted according to the sizes of the final PV panel and the related process box.

BRIEF DESCRIPTION OF DRAWINGS

FIG. 2*a*) and FIG. 2*b*) shows a standard design of the existing selenization/sulfurization process box in an embodiment, where FIG. 2*a*) shows a three-dimensional view, and FIG. 2*b*) shows a detailed side view;

FIG. 5*a*) standard design.

FIG. 6*a*) simulated gas streamlines of improved design 1 (FIG. 5*b*)

DESCRIPTION OF EMBODIMENTS

In the present invention, a slot-die type first gas distribution device and a first communication device are designed on the gas inlet portion at a process box inlet, a slot-die type second gas distribution device and a third communication device are designed on the gas outlet portion at a process chamber outlet, and thereby, the problem of nonuniform gas distribution in a photovoltaic manufacturing process box is solved.

Embodiment 1

Figure 7:
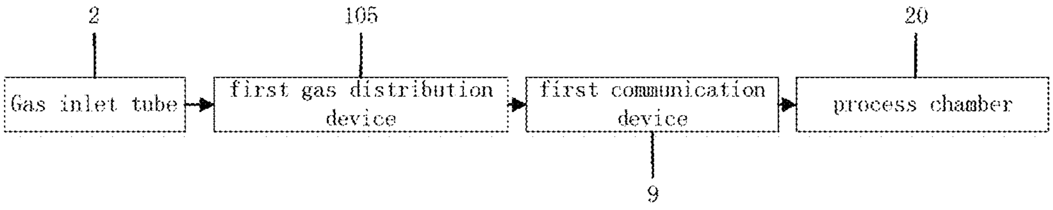
FIG. 7 shows a schematic diagram of the connection relationship between a first gas distribution device and a first communication device designed at the gas inlet portion of a process chamber in the present invention.

Referring to FIG. 7, for the gas inlet portion at the process box inlet, the first gas distribution device adopting the slot-die design is designed to replace a manifold 3 used in a standard design. In the present embodiment, the first gas distribution device 105 and the first communication device 9 are adopted to distribute and transmit gas into a process chamber 20. The first communication device 9 is a flat quadrangular hollow box (interconnection slit), with two opposite sides of the hollow box being uncovered and used as an inlet and an outlet respectively, and the shapes and sizes of a first outlet, a first communication device inlet, a first communication device outlet and a process chamber inlet are the same. With regard to the hollow box, the length is greater than the width, the width is greater than the height, and the two uncovered sides of the hollow box are parallel to the height direction of the hollow box, that is, a hollow box inlet is long and narrow.

Figure 8:
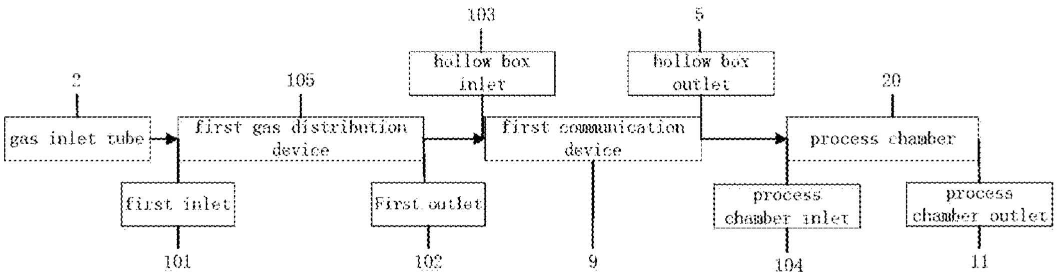
FIG. 8 shows another schematic diagram of the design of the gas inlet portion of the process chamber in the present invention.

Referring to FIG. 8, at the gas inlet portion of the process box, the gas passes through a gas inlet tube inlet 1, a gas inlet tube 2, a gas inlet tube outlet, a first gas distribution device inlet (i.e. a first inlet) 101, the first gas distribution device 105, a first gas distribution device outlet (i.e. the first outlet) 102, a first communication device inlet (i.e. the hollow box inlet) 103, the first communication device 9, a first communication device outlet (i.e. a hollow box outlet, i.e. gas orifice) 5 and the process chamber inlet 104 in sequence, and is then transmitted into a process chamber 20.

The first communication device inlet is rectangular, and the length and width of the first communication device inlet are the length and height of the first communication device (flat quadrangular hollow box). The shapes and sizes of the first outlet 102, the first communication device inlet 103, the first communication device outlet 5 and the process chamber inlet 104 are the same. Further, after the gas is transmitted out from the first outlet 102 of the first gas distribution device 105, the size and shape of the gas flow section always remain the same in the process of flowing through the first communication device inlet 103, the first communication device 9, the first communication device outlet 5 and the process chamber inlet 104.

Preferably, the ratio of the length, width and height of the flat quadrangular hollow box is between 5000:20:1 and 20000:100:1, that is, the ratio of the lengths and widths of the first outlet, the first communication device inlet, the first communication device outlet and the process chamber inlet is between 5000:1 and 20000:1.

Further, the first gas distribution device 105 includes a first gas distribution tube 1051, and the first inlet is arranged at the top of the first gas distribution tube. Preferably, the first inlet is arranged at the center of the top of the first gas distribution tube, and the position of the first outlet is lower than that of the first inlet. It can be understood that the shape and size of the first inlet depend on those of the gas inlet tube 2, and the first outlet is long and narrow.

Figure 9:
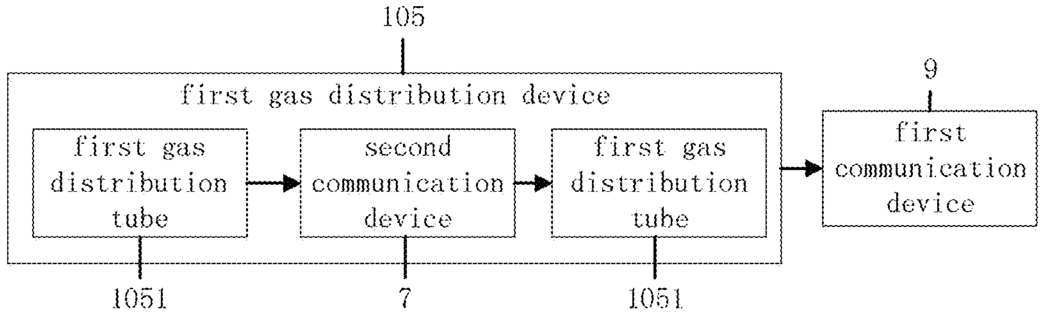
FIG. 9 shows a schematic structural diagram of the first gas distribution device in the present invention.

Further, referring to FIG. 9, the first gas distribution device 105 may include a plurality of first gas distribution tubes 1051, for example, m first gas distribution tubes 1051 are communicated in sequence to form a first gas distribution device 105. For convenience, the m first gas distribution tubes are also communicated with one another by using the aforementioned first communication device, and here, the first communication device 9 used between the m first gas distribution tubes is referred to as a second communication device 7. It can be understood that the second communication device 7 and the first communication device 9 are actually the same device, and "first" and "second" here are only intended to distinguish the different installation positions of the communication device.

Further, the aforementioned m is equal to 2, so that a uniform gas distribution process can be implemented multiple times, increasing the uniformity of the gas entering the process chamber. For example, in FIG. 9, the first inlet is arranged at the center of the top of the first gas distribution tube 1051, the first outlet is arranged at a position below the top on the last first gas distribution tube, and thereby, the gas enters from the top of the first gas distribution tube 1051. The uniform gas distribution process is carried out in the first gas distribution tube 1051 for the first time, the gas is then transmitted into the last first gas distribution tube 1051 through the second communication device 7 to undergo the uniform gas distribution process for the second time, and the gas is then transmitted to the process chamber 20 through the first communication device 9. Therefore, in the gas inlet portion at the process box inlet, before entering the process chamber, the gas enters the first gas distribution device 105 from the gas inlet tube 2, and undergoes the uniform gas distribution process at least twice in the first gas distribution device 105, and the area, shape and height of the flow section of the gas flow always remain the same when the gas is transmitted through the second communication device 7, the first outlet 102, the first communication device 9 and the process chamber inlet 104, thus effectively ensuring the uniformity of distribution of the gas entering the process chamber.

Figure 10:
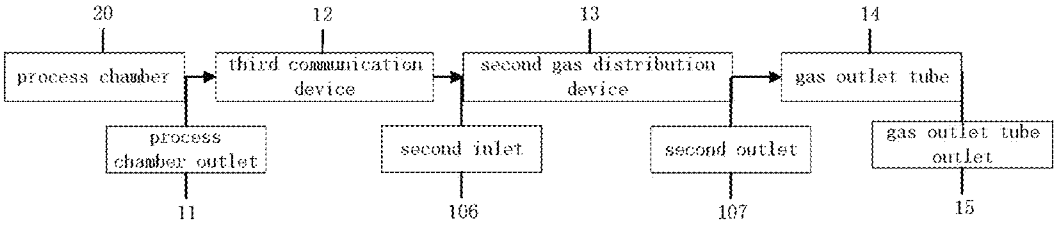
FIG. 10 shows a schematic diagram of the connection relationship between a second gas distribution device and a third communication device designed at the gas outlet portion of the process chamber in the present invention.

Further, referring to FIG. 10, the present invention designs a second gas distribution device adopting the slot-die design for the gas outlet portion at a process box outlet. The design of the second gas distribution device 13 is similar to that of the first gas distribution device 105. Specifically, the second gas distribution device 13 is provided with a second inlet 106 and a second outlet 107, a process chamber outlet 11 is connected to the second inlet 106, and the second outlet 107 is connected to a gas outlet tube 14.

The process chamber outlet 11 and the second inlet 106 (the second gas distribution device 13) are communicated with each other through a third communication device 12, which has the same structure as the first communication device 9. It can be understood that the third communication device 12 is actually the same as the first communication device 9 and the second communication device 7, and "third", "first" and "second" here are only intended to distinguish the different installation positions of the communication device. After a photovoltaic device is processed in the process chamber, the gas flows out from the process chamber outlet 11, and flows into the second gas distribution device 13 through the third communication device 12. Referring to the above description of the gas inlet portion of the process chamber, at the gas outlet portion of the process chamber, the process chamber outlet 11, the inlet of the third communication device 12, the outlet of the third communication device 12 and the second inlet 106 are all long and narrow, with the shapes and sizes being the same as those of the uncovered sides of the hollow box as the third communication device 12. That is, the lengths of the process chamber outlet 11, the inlet of the third communication device 12, the outlet of the third communication device 12 and the second inlet 106 are equal to that of the third communication device 12, and the widths of the process chamber outlet 11, the inlet of the third communication device 12, the outlet of the third communication device 12 and the second inlet 106 are equal to the height of the third communication device 12. The area and shape of the gas flow section of the gas flowing out of the process chamber outlet 11 remain the same in the whole process of flowing.

The second gas distribution device 13 includes a second gas distribution tube, the second outlet is arranged at the top of the second gas distribution tube (preferably, at the center of the top of the second gas distribution tube), and the position of the second inlet is lower than that of the second outlet. The second inlet is arranged along the length direction of the second gas distribution tube, and the length of the second inlet is equal to that of the second gas distribution tube. It can be known from the above that the lengths of the process chamber outlet 11, the third communication device 12 and the second gas distribution device 13 are equal.

Because there is no need to redistribute the gas for multiple times, only one second gas distribution tube is used for gas collection in the second gas distribution device 13, and the gas in the second gas distribution tube passes through the gas outlet tube 14 after being uniformly distributed, and finally leaves a gas outlet tube outlet 15.

It should be noted that the height of the second inlet of the process chamber outlet portion is greater than that of the first outlet of the process chamber inlet portion, that is, the height of the process chamber outlet is greater than that of the process chamber inlet.

Embodiment 2

Figure 11:
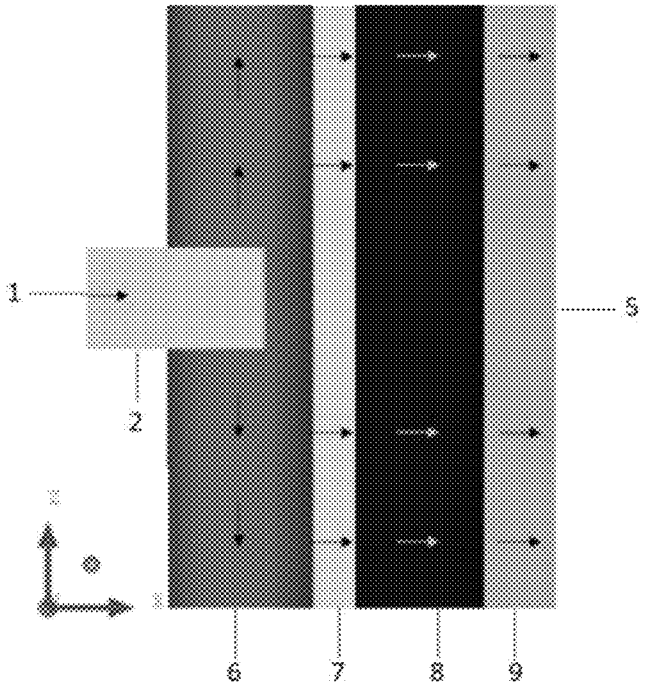
FIG. 11*a*) and FIG. 11*b*) is a schematic structural diagram of the gas inlet portion when the first gas distribution device is semicircular in the present invention, where FIG. 11*a*) shows a top view, and FIG. 11*b*) shows a side view.
Figure 11:
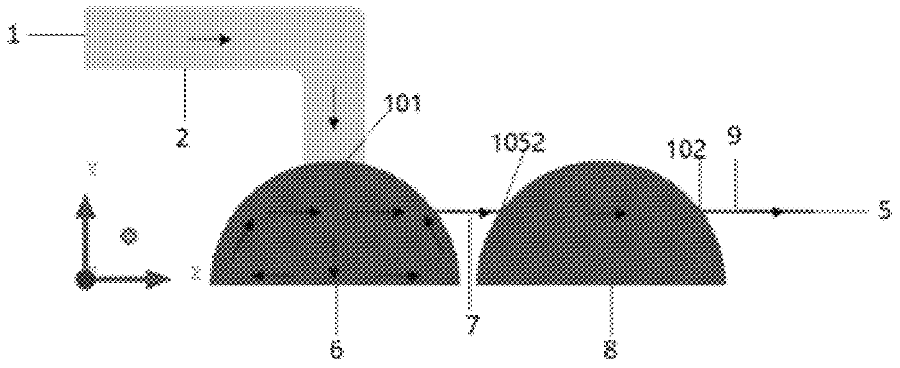

In the present embodiment, the first gas distribution tube 1051 is semicircular. Referring to FIG. 11*a*) and FIG. 11*b*), FIG. 11*a*) shows a top view, and FIG. 11*b*) shows a side view. The arrows indicate the movement of the gas flow. In order to avoid unnecessary repetition, only the differences with respect to the first gas distribution device in the aforementioned embodiment will be explained.

In the present embodiment, the first gas distribution device includes two semicircular manifolds, i.e. half cylindrical first gas distribution pipeline 6 and first gas distribution pipeline 8, with the rectangular plane of the semicircular manifold being located beneath the curved surface of the semicircular manifold and parallel to the ground.

The first inlet 101 is arranged on the curved surface of the first semicircular manifold 6 (preferably, at the center of the curved surface), and the height of the first inlet 101 from the rectangular plane of the semicircular manifold is the radius of the semicircular manifold.

The two semicircular manifolds are connected with each other through the second communication device 7, the first outlet 102 is arranged on the curved surface of the second semicircular manifold 8, and the height of the first outlet 102 is less than that of the first inlet 101. When there are a plurality of first gas distribution tubes in the first gas distribution device, each first gas distribution tube is further provided with a gas flow orifice 1052 for communicating the first gas distribution tube (6, 8) with the second communication device 7.

The first outlet is arranged along the length direction of the semicircular manifold 8, the distance between the two semi-circular planes of the semicircular manifold 8 is the length of the semicircular manifold 8, and the length of the first outlet 102 is equal to that of the semicircular manifold 8. Thus, the gas is uniformly distributed for the first time in the first semicircular manifold 6, transmitted to the second semicircular manifold 8 through the second communication device 7, uniformly distributed for the second time in the second semicircular manifold 8 and transmitted to the process chamber 20 through the first communication device 9, and the height, area and shape of the gas flow section at each inlet/outlet remain the same before the gas enters the process chamber.

Since the two semicircular manifolds (6, 8) are used to carry out the uniform gas distribution process twice, the uniformity of distribution of the gas in the first gas distribution tube along the Z axis is greatly increased. In order to realize the laminar gas flow in the second communication device 7 and the first communication device 9, and the ratio of the lengths, widths and heights of the second communication device 7 and the first communication device 9 is between 5000:20:1 and 20000:100:1.

Figure 12:
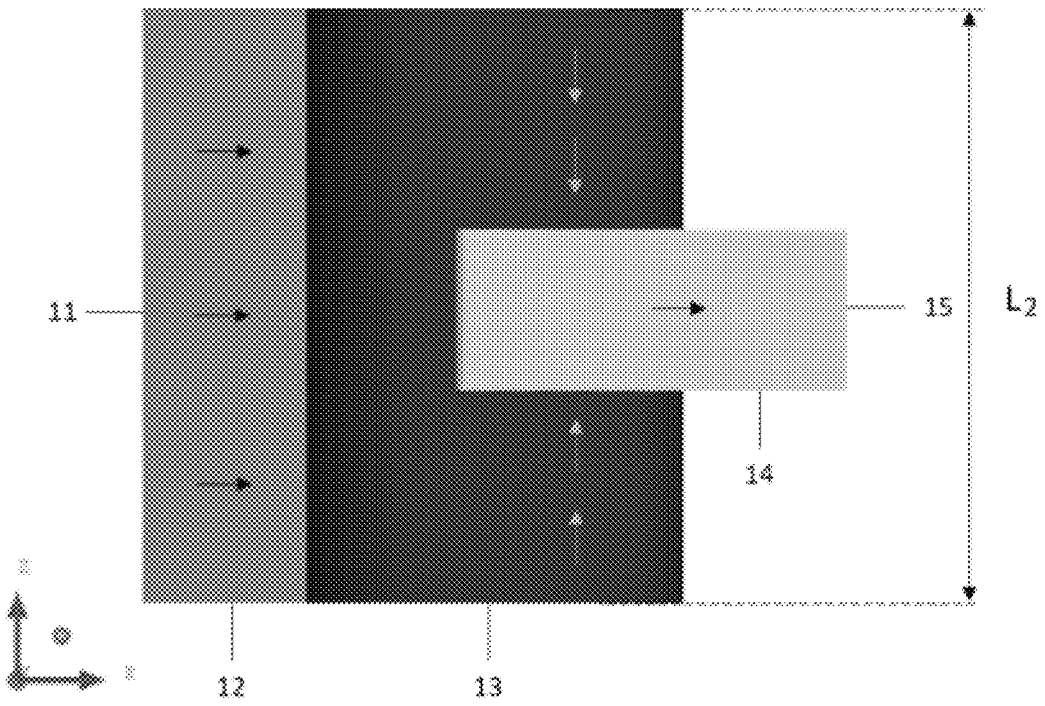
FIG. 12*a*) and FIG. 12*b*) is a schematic structural diagram of the gas outlet portion when the second gas distribution device is semicircular in the present invention, where FIG. 12*a*) shows a top view, and FIG. 12*b*) shows a side view.
Figure 12:
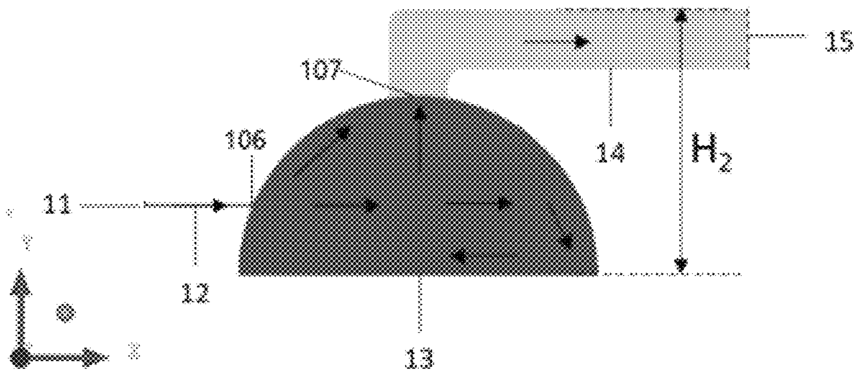

In the present embodiment, the second gas distribution tube is semicircular. Referring to FIG. 12*a*) and FIG. 12*b*), FIG. 12*a*) shows a top view, and FIG. 12*b*) shows a side view. The arrows indicate the movement of the gas flow. In order to avoid unnecessary repetition, only the differences with respect to the second gas distribution device in the aforementioned embodiment will be explained.

In the present embodiment, the second gas distribution device includes a semicircular second gas distribution manifold, the rectangular plane of the semicircular manifold of the second gas distribution tube is located beneath the curved surface of the semicircular manifold, and the rectangular plane of the semicircular manifold of the second gas distribution device is parallel to the ground.

The second inlet 106 is arranged on the curved surface of the semicircular manifold, and the height of the second inlet from the rectangular plane of the semicircular manifold is less than the radius of the semicircular manifold.

The second outlet 107 is arranged at the center of the curved surface of the semicircular manifold, and the height of the second outlet from the rectangular plane of the semicircular manifold is the radius of the semicircular manifold.

Figure 1:
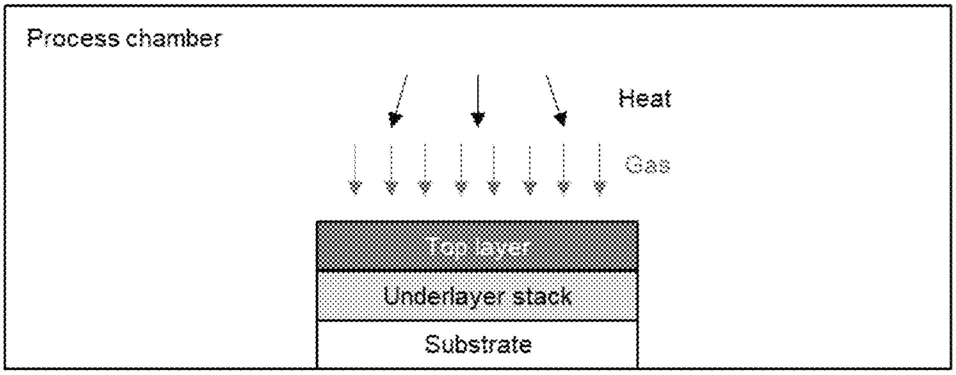
FIG. 1 shows a schematic diagram of some photovoltaic stacks (top layer+lower stack) reacting with gas under a heating condition in a process chamber.
Figure 3:
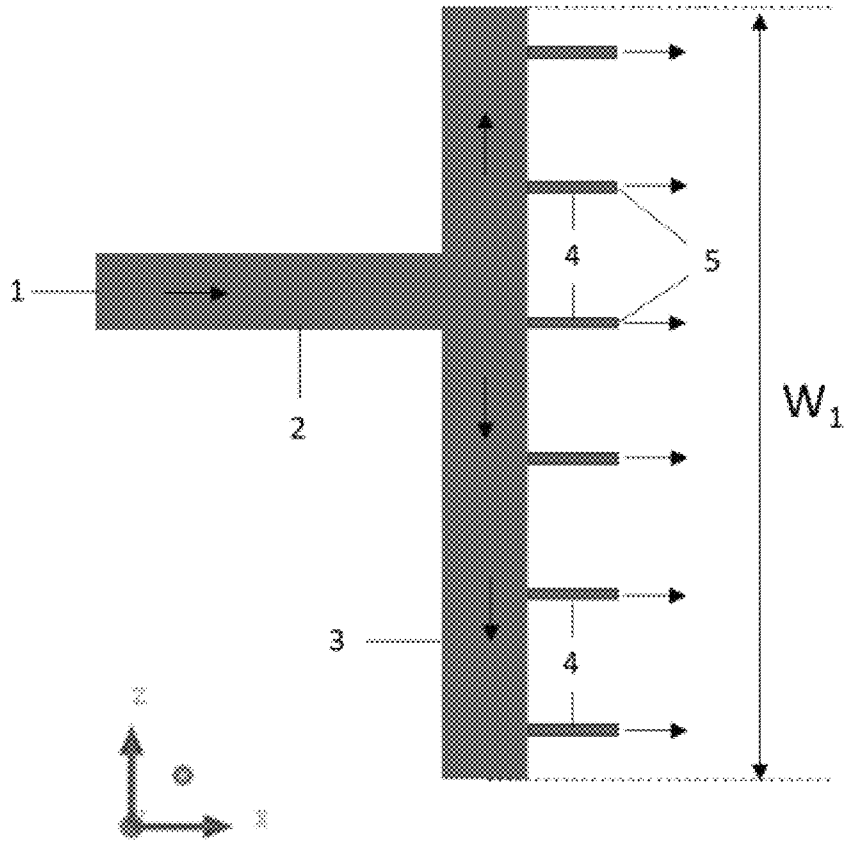
FIG. 3*a*) and FIG. 3*b*) shows a standard design of the left gas inlet portion in an embodiment of the existing selenization/sulfurization process device, where FIG. 3*a*) shows a top view, and FIG. 3*b*) shows a side view.
Figure 3:
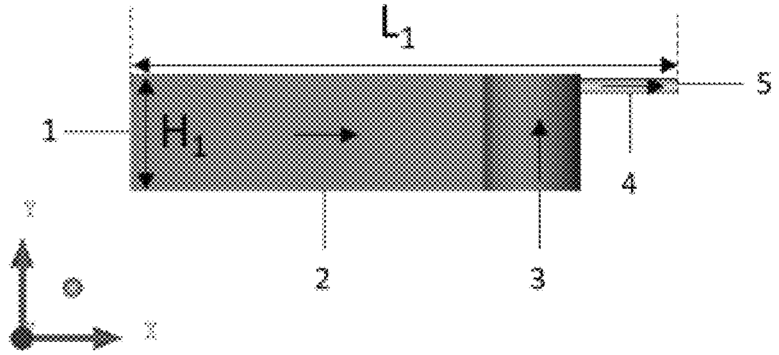
Figure 4:
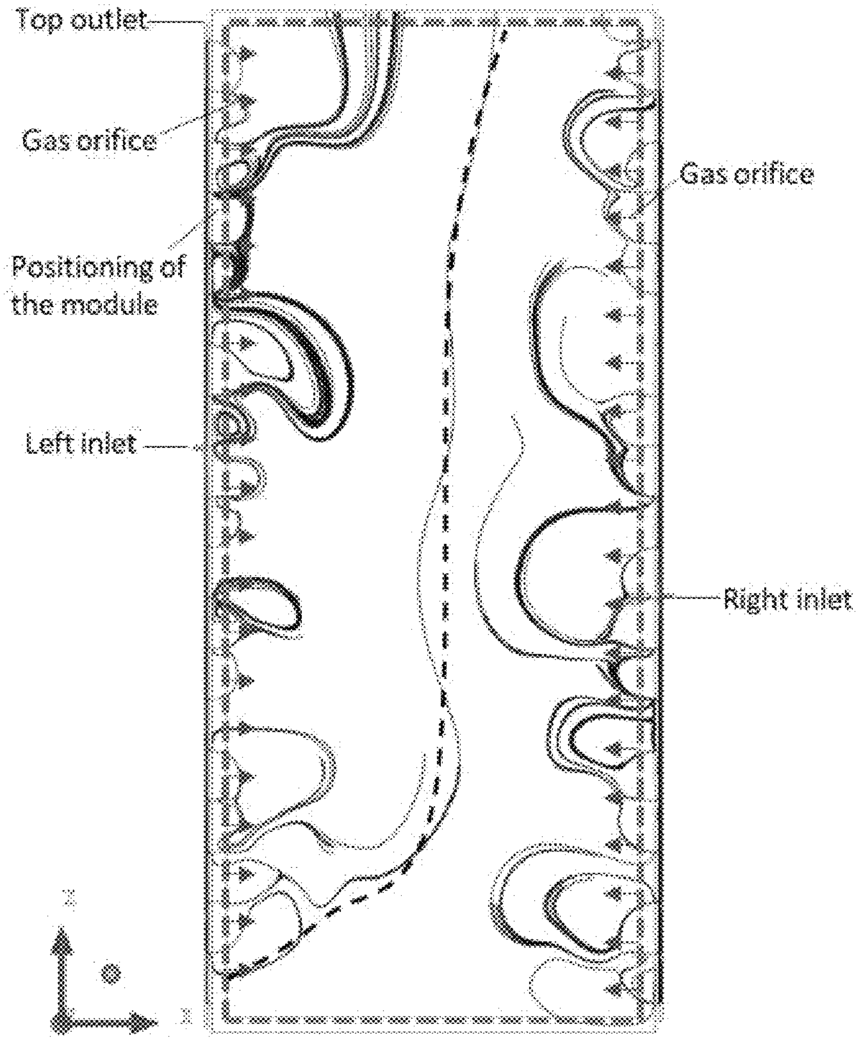
FIG. 4*a*) and FIG. 4*b*) shows a schematic diagram of nonuniform gas distribution in an embodiment of a standard selenization/sulfurization process box, where FIG. 4*a*) shows simulated gas streamlines in the selenization/sulfurization process box, and FIG. 4*b*) shows an optically scanned picture of the top layer of a related photovoltaic stack processed in the standard selenization/sulfurization process box under the same process conditions.
Figure 4:
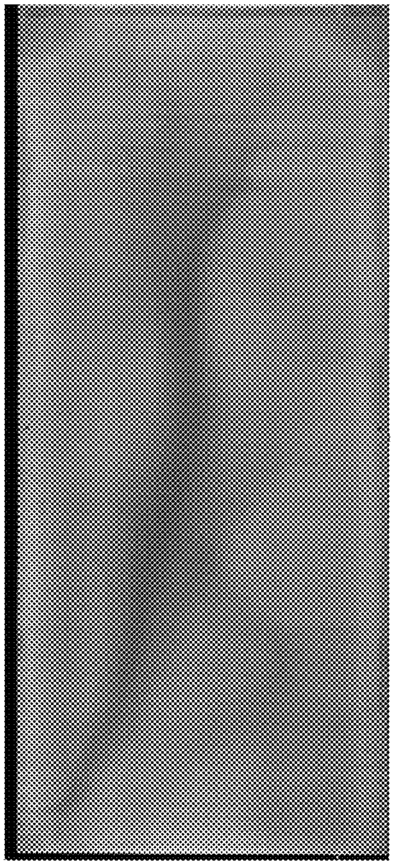
Figure 5:
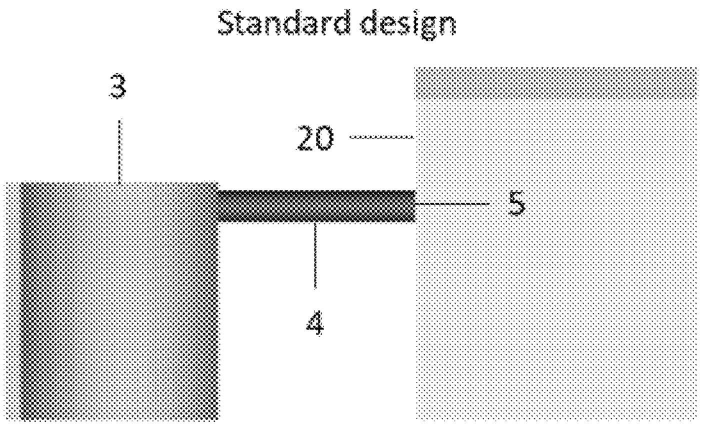
FIG. 5*a*), FIG. 5*b*) and FIG. 5*c*) shows different existing designs of the gas inlet section of the process chamber.
FIG. 5*b*) modified design 1.
FIG. 5*c*) modified design 2.
Figure 5:
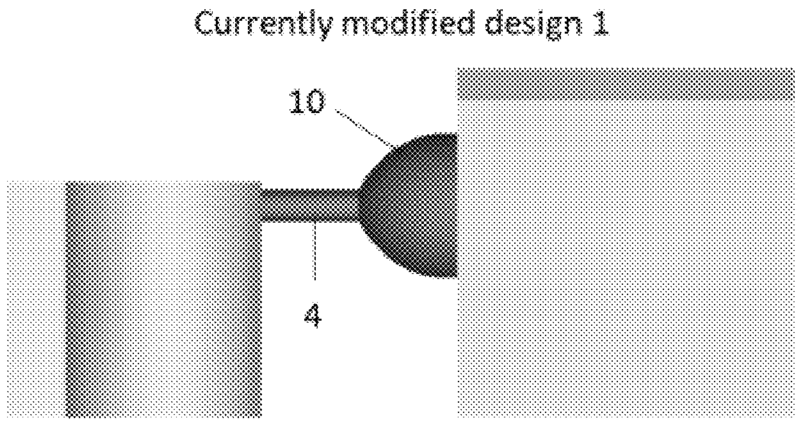
Figure 5:
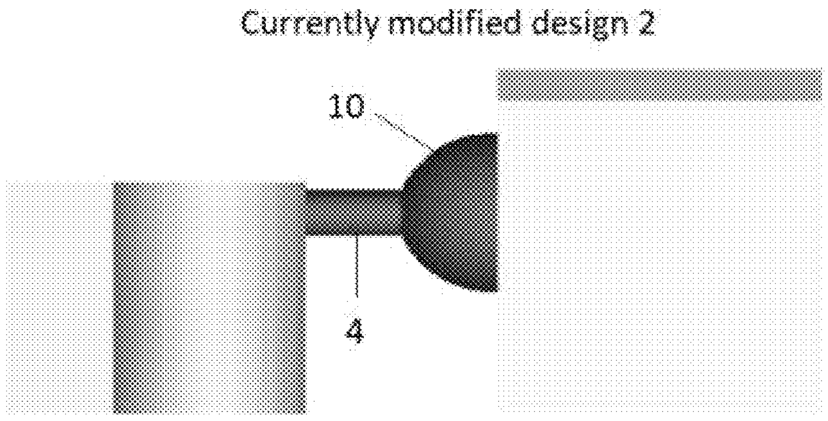
Figure 6:
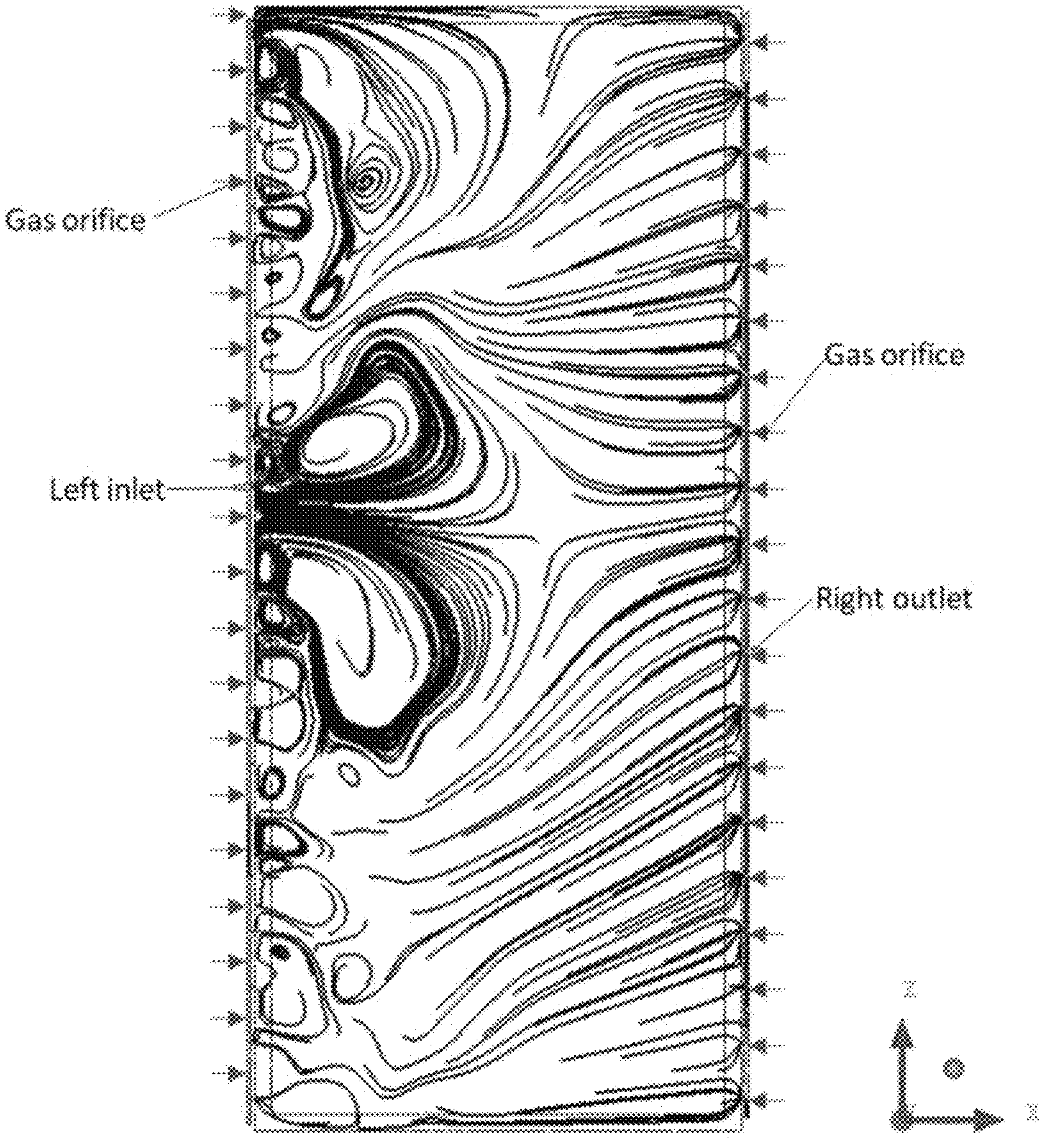
FIG. 6*a*) and FIG. 6*b*) shows nonuniform gas distribution in two improved process boxes.
FIG. 6*b*) simulated gas streamlines of improved design 2 (FIG. 5*c*))
Figure 6:
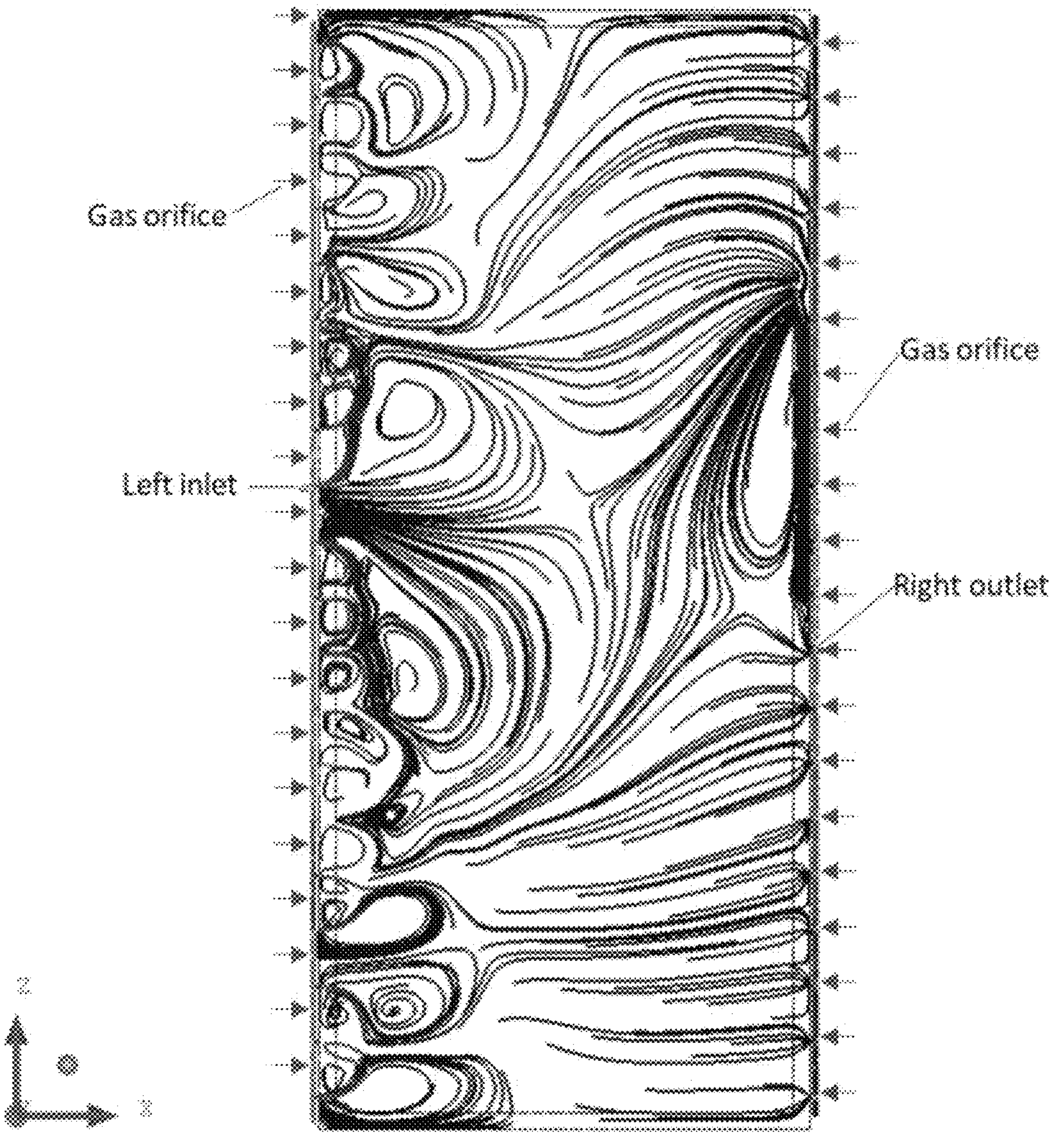

In order to evaluate the influence of the design of the gas inlet portion and gas outlet portion of the process box of the present embodiment on the gas uniformity in the process chamber, the same hydrodynamic simulation as in FIG. 4*a*), FIG. 4*b*), FIG. 6*a*) and FIG. 6*b*) was carried out. For simulation settings, the top and other boundaries of the process box are arranged as normal walls, that is, there is no gas outlet. The gas is jetted out from the left inlet and leaves from the right outlet. The other boundary conditions remain the same as in FIG. 4*a*), FIG. 4*b*), FIG. 6*a*) and FIG. 6*b*).

FIGS. 13, 14, 15 and 16 describe the related simulation results of gas velocities in X, Y and Z axis and gas streamline distributions, respectively.

Figure 13:
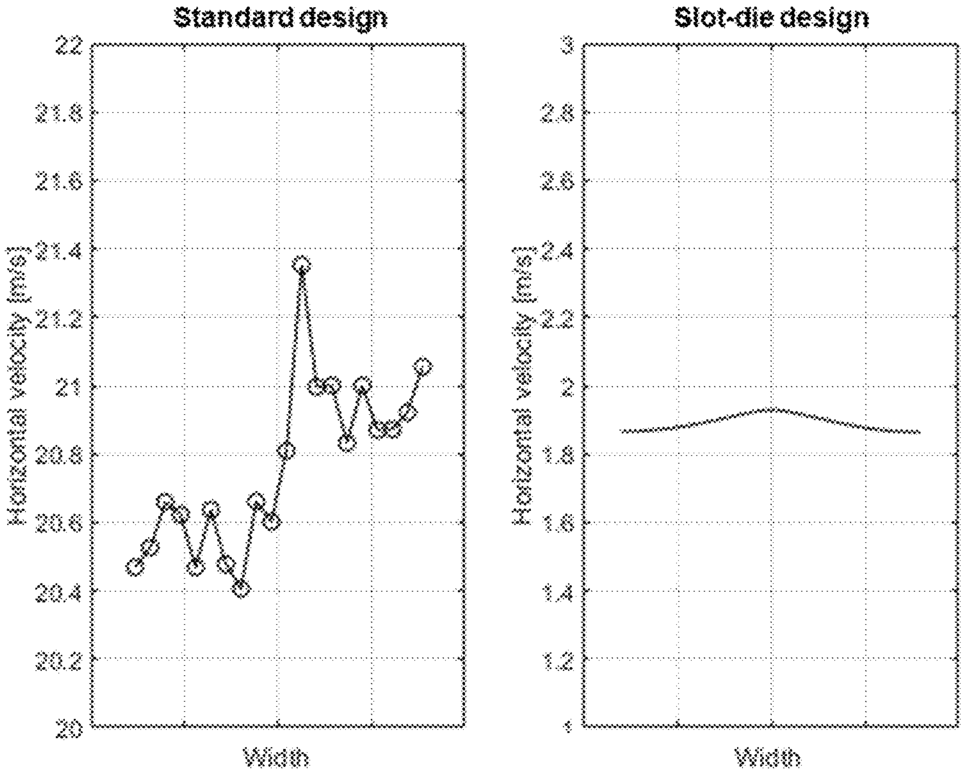
FIG. 13 is the comparison of the gas velocities in X axis between the standard design and a slot-die type design of the present invention in the case of adopting the designs of FIGS. 11*a*), 11*b*), 12*a*) and 12*b*)

FIG. 13 shows the comparison between gas velocities in X axis in the standard design (FIG. 4*a*) and FIG. 4*b*)) and in the slot-die type gas distribution device design (FIG. 11*a*), FIG. 11*b*), FIG. 12*a*) and FIG. 12*b*)) in the embodiments of the present invention. In FIG. 13, for the standard design, the circled lines should represent the gas velocity distribution, where each circle represents the gas outlet velocity at the outlet 5. For the slot-die design, the gas velocity in FIG. 13 is a continuous solid line, because a square-edged outlet 5 is applied. It can be clearly seen that with the help of the slot-die design, the velocity distribution of the related gas in X axis is more uniform than that in the standard design. The variation between the maximum and minimum gas velocities between the twenty outlets 5 in the standard design is about 1 m/s. For the slot-die type gas distribution device design in the embodiments of the present invention, the gas velocity change is about 0.1 m/s, that is, the distribution of the gas ejection in X axis is much more uniformly distributed along the Z axis than that in the standard design.

Figure 14:
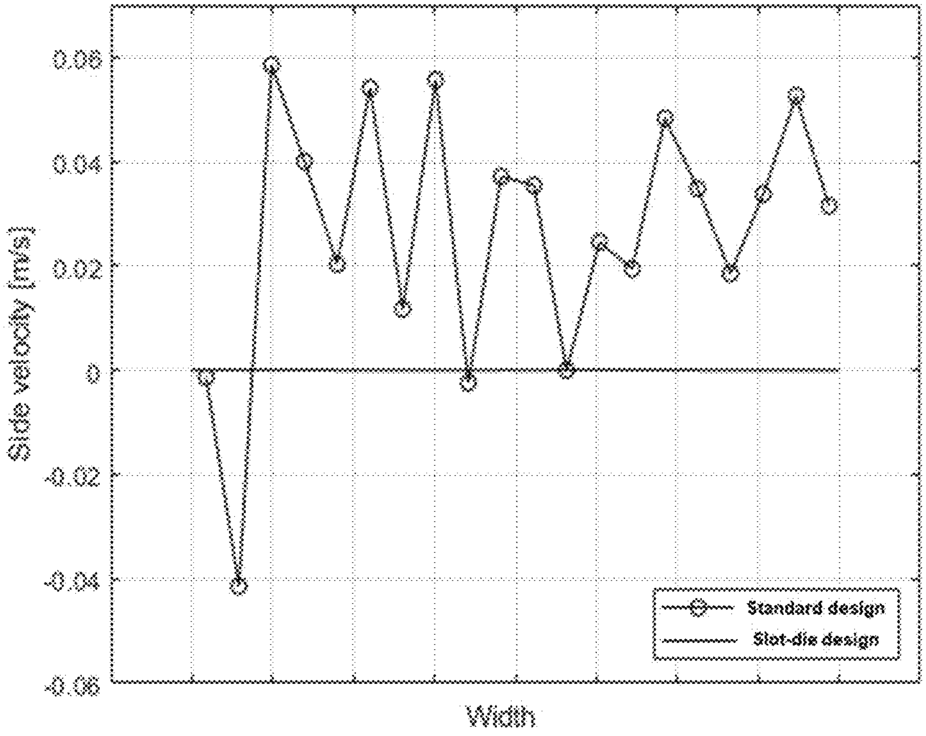
FIG. 14 is the comparison of the gas velocities in Y axis between the standard design and the slot-die type design of the present invention in the case of adopting the designs of FIGS. 11*a*), 11*b*), 12*a*) and 12*b*)
Figure 15:
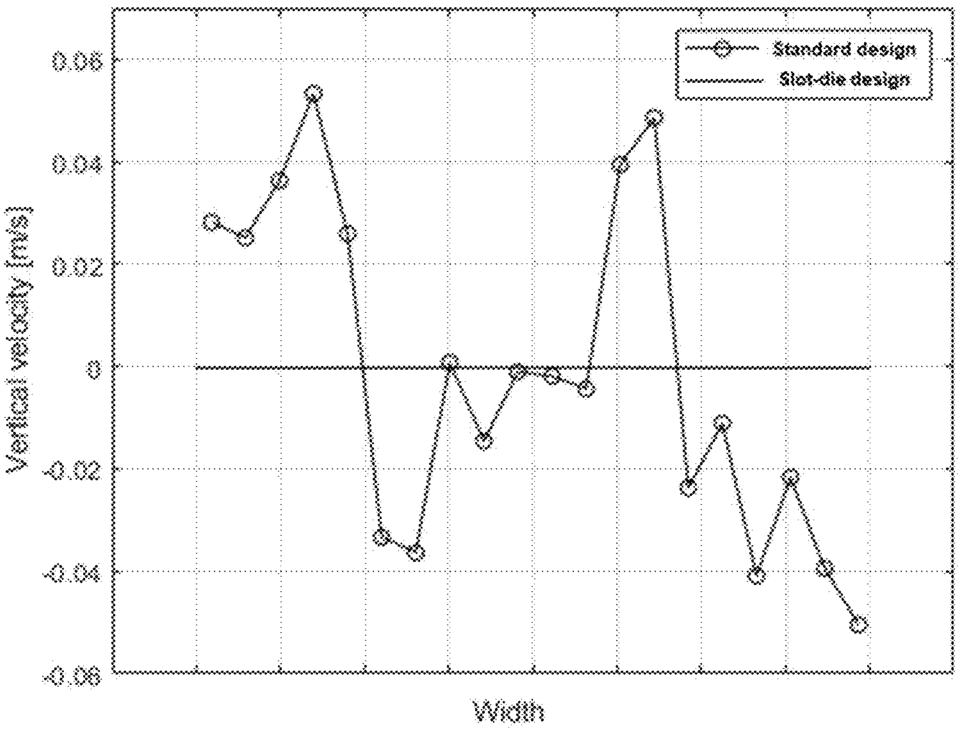
FIG. 15 is the comparison of the gas velocities in Z axis between the standard design and the slot-die type design of the present invention in the case of adopting the designs of FIGS. 11*a*), 11*b*), 12*a*) and 12*b*)

FIGS. 14 and 15 show the comparison between gas velocities in Y axis and Z axis in the standard design and the slot-die type gas distribution device design of the embodiments of the present invention respectively. Obviously, for the standard design, the gas velocity variation in Y axis and Z axis is about 0.1 m/s, while the gas velocity variation in the slot-die design is negligible.

Figure 16:
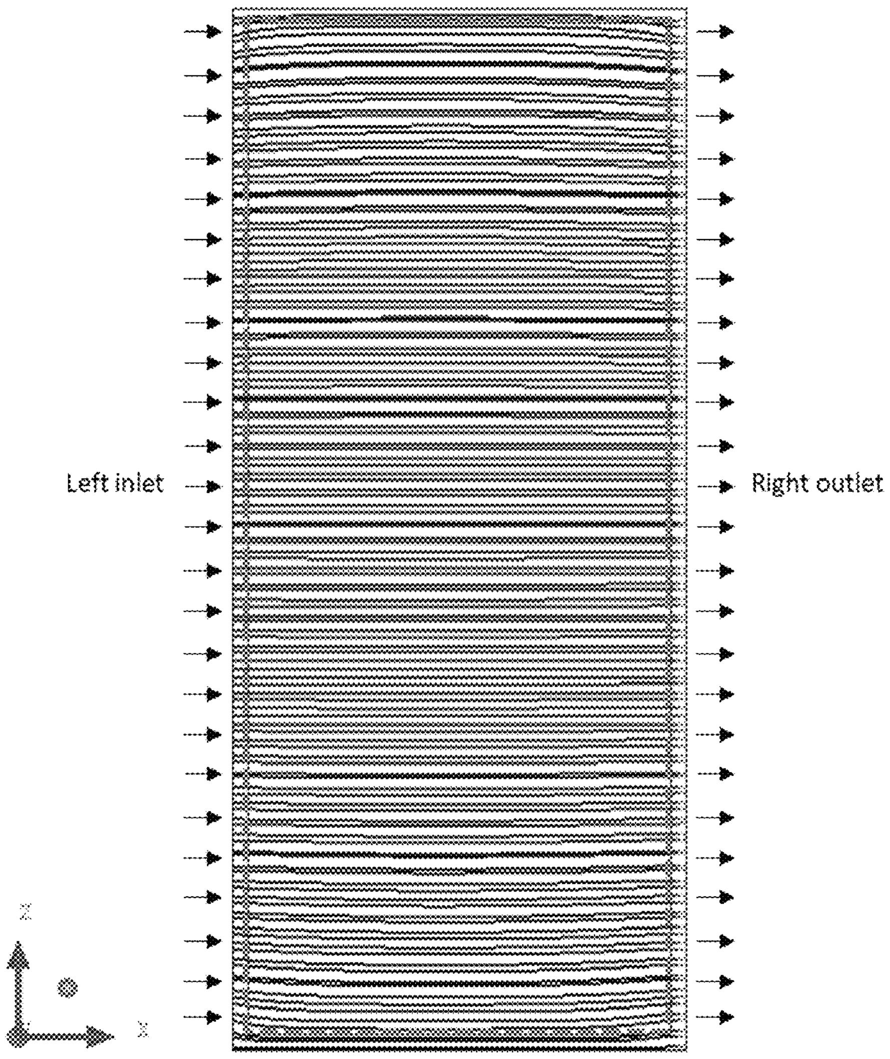
FIG. 16 is a schematic diagram of simulated gas streamlines in the process chamber in the case of adopting the designs of FIGS. 11*a*), 11*b*), 12*a*) and 12*b*)

FIG. 16 shows the gas distribution streamlines in the process chamber adopting the slot-die design according to the embodiments of the present invention. It clearly indicates that neither finger-shaped gas jets nor gas vortexes can be observed here. The gas streamlines are parallel to one another, and the flow of the gas is more uniformly distributed in the whole process chamber.

Embodiment 3

Figure 17:
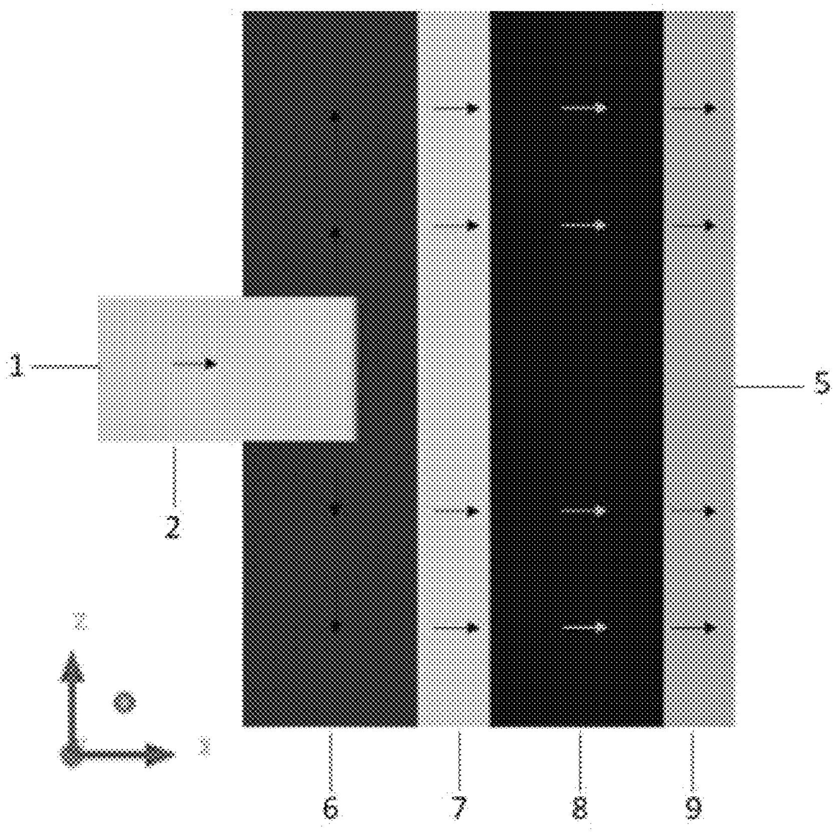
FIG. 17*a*) and FIG. 17*b*) is a schematic diagram of first gas distribution tubes at the gas inlet portion according to a further embodiment adopting two tetragonal designs with the same size, where FIG. 17*a*) shows a top view, and FIG. 17*b*) shows a side view.
Figure 17:
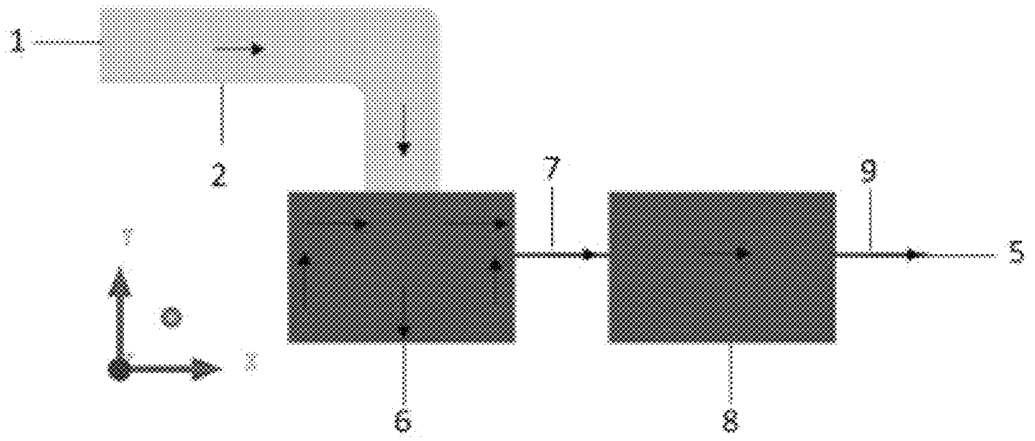

In order to avoid unnecessary repetition, only the differences with respect to the aforementioned embodiment will be explained. Referring to FIG. 17*a*) and FIG. 17*b*), FIG. 17*a*) shows a top view, and FIG. 17*b*) shows a side view. The arrows indicate the movement of the gas flow. In the present embodiment, the first gas distribution tubes 1051 in the first gas distribution device are manifolds with rectangular configuration, and the two first gas distribution tubes 1051 have the same size. Since the two first gas distribution tubes 1051 are used to implement the uniform gas distribution process twice, similar uniform gas distribution can be realized in the process chamber 20.

Embodiment 4

Figure 18:
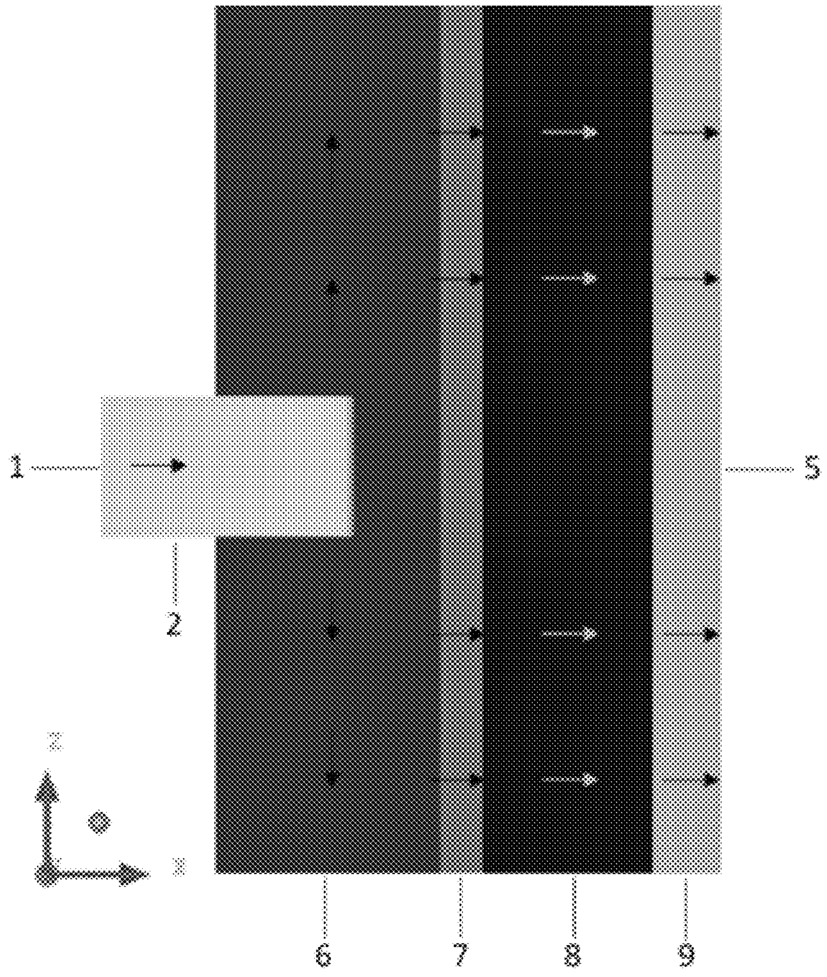
FIG. 18*a*) and FIG. 18*b*) is a schematic diagram of first gas distribution tubes at the gas inlet portion according to a further embodiment adopting two tetragonal designs with different sizes, where FIG. 18*a*) shows a top view, and FIG. 18*b*) shows a side view.
Figure 18:
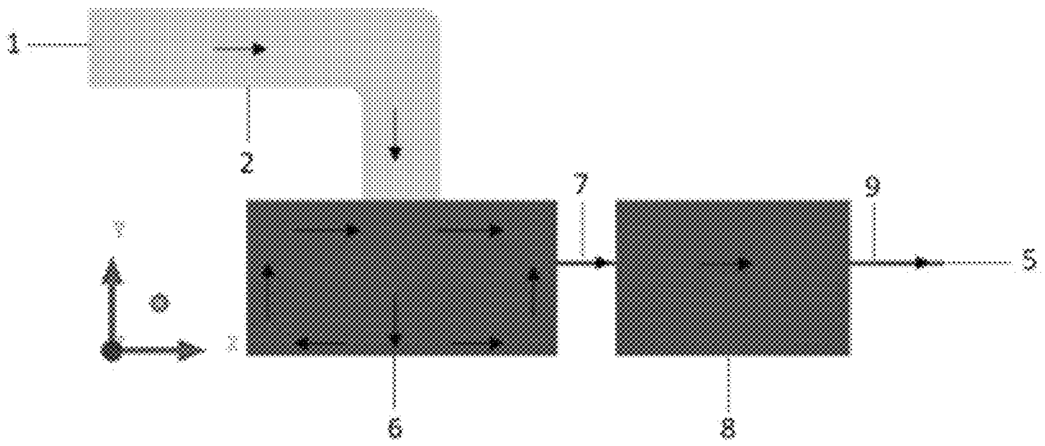

In order to avoid unnecessary repetition, only the differences with respect to the aforementioned embodiment will be explained. Referring to FIG. 18*a*) and FIG. 18*b*), FIG. 18*a*) shows a top view, and FIG. 18*b*) shows a side view. The arrows indicate the movement of the gas flow. In the present embodiment, the first gas distribution tubes 1051 in the first gas distribution device are manifolds with rectangular configuration, and the two first gas distribution tubes 1051 have different sizes. Since the first gas distribution tube 1051 is larger than the size shown in FIG. 17*a*) and FIG. 17*b*), the gas flow distribution at the outlet 5 along Z axis can be slightly improved in comparison with the design of FIG. 17*a*) and FIG. 17*b*).

Figure 19:
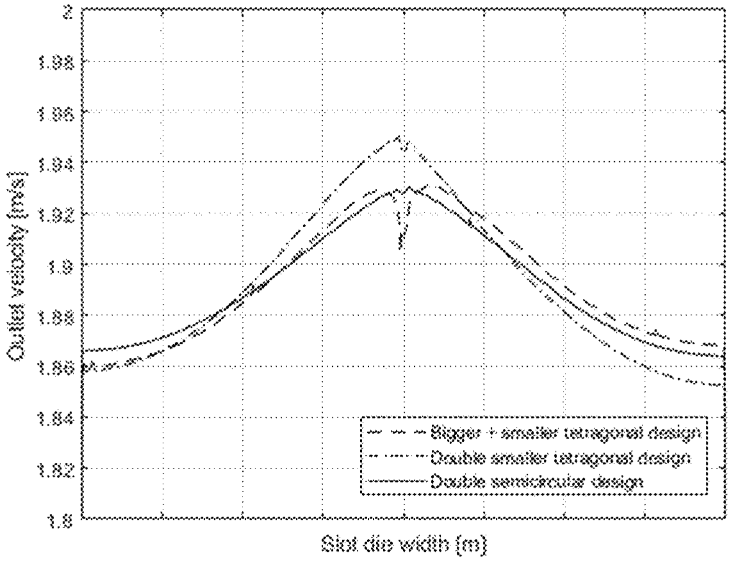
FIG. 19 is a comparison of the gas velocity in X axis in the semicircular design and in two tetragonal designs adopted by the first gas distribution device.

FIG. 19 shows the comparison between gas velocities in X axis in the aforementioned two designs of FIG. 17*a*), FIG. 17*b*), FIG. 18*a*) and FIG. 18*b*), and the gas distribution effects of these two designs are also compared with that of the semicircular design shown in FIG. 13. It can be seen that similar to the semicircular design, the gas flow velocity output by the larger tetragonal first gas distribution tube 1051 is more uniform than that output by the smaller tetragonal first gas distribution tube 1051.

Embodiment 5

Figure 20:
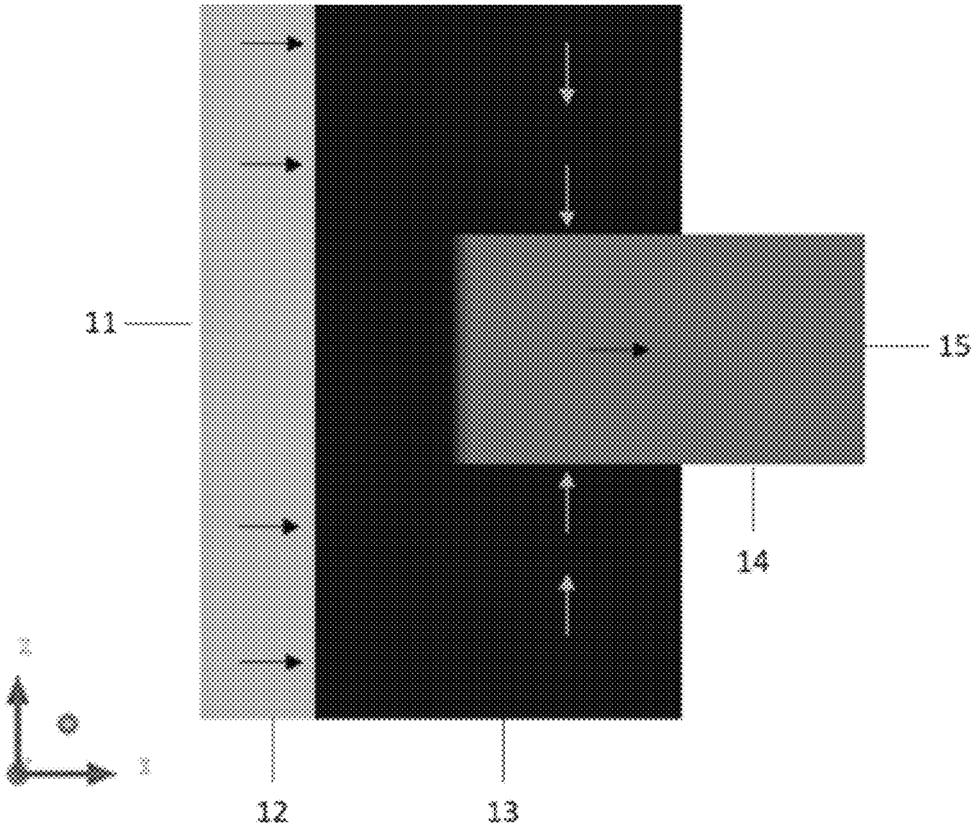
FIG. 20*a*) and FIG. 20*b*) is a schematic diagram of a second gas distribution device at the gas outlet portion according to a further embodiment adopting a tetragonal design, where FIG. 20*a*) shows a top view, and FIG. 20*b*) shows a side view.
Figure 20:
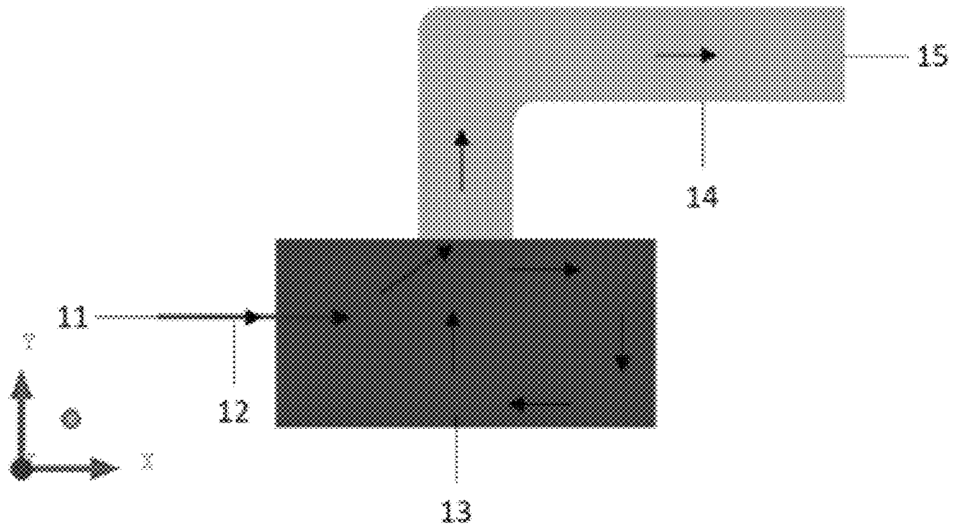

In order to avoid unnecessary repetition, only the differences with respect to the aforementioned embodiment will be explained. Referring to FIG. 20*a*) and FIG. 20*b*), FIG. 20*a*) shows a top view, and FIG. 20*b*) shows a side view. The arrows indicate the movement of the gas flow. In the embodiments of the present invention, another embodiment is provided for the design of the gas outlet portion of the process chamber. In the gas outlet portion of the process chamber, the second gas distribution tube of the second gas distribution device adopts a manifold tetragonal design.

Embodiment 6

Figure 21:
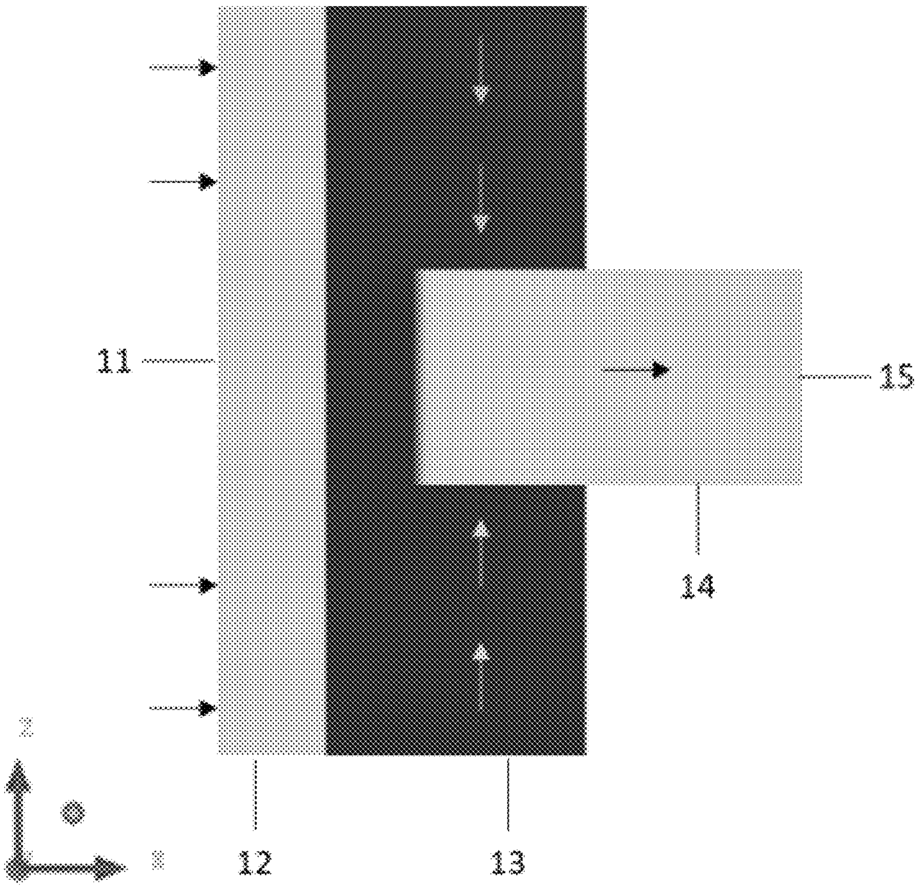
FIG. 21*a*) and FIG. 21*b*) is a schematic diagram of the second gas distribution device at the gas outlet portion according to a further embodiment adopting a tetragonal design with a smaller size, where FIG. 21*a*) shows a top view, and FIG. 21*b*) shows a side view.
Figure 21:
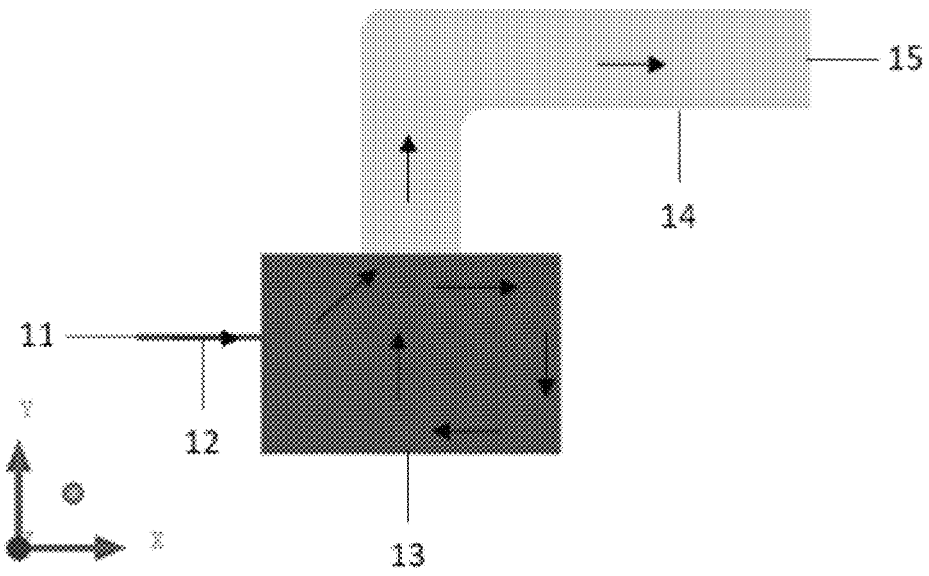

In order to avoid unnecessary repetition, only the differences with respect to the aforementioned embodiment will be explained. Referring to FIG. 21*a*) and FIG. 21*b*), FIG. 21*a*) shows a top view, and FIG. 21*b*) shows a side view. The arrows indicate the movement of the gas flow. In the embodiments of the present invention, in the gas outlet portion of the process chamber, the second gas distribution tube of the second gas distribution device adopts a manifold with tetragonal design, and the size of the tetragonal second gas distribution tube is smaller than that in Embodiment 5.

In a word, the present invention provides a slot-die type gas distribution device for photovoltaic manufacturing, and provides slot-die type gas distribution structure designs at the gas inlet portion and the gas outlet portion, respectively. Compared with the standard design using the manifold with a plurality of outlet tubes, the present invention realizes more uniform gas distribution in the process box by setting each inlet/outlet in the gas flow process into a long and narrow shape, effectively improving the semiconductor performance and appearance of photovoltaic products.

The present invention is not limited to the aforementioned specific embodiments, and various changes which are made by those of ordinary skill in the art from the above idea without creative labor shall fall within the protection scope of the present invention.

LIST OF REFERENCE CHARACTERS

1 gas inlet tube inlet
2 gas inlet tube
3 gas manifold
4 transfer tube
5 hollow box outlet
6, 8, 1051 first gas distribution tube
7 second communication device
9 first communication device
10 bowl-shaped hole
11 process chamber outlet
12 third communication device
13 second gas distribution device
14 gas outlet tube
15 gas outlet tube outlet
16 process box
17 bottom plate
18 substrate
19 cover plate
20 process chamber
101 first inlet
102 first outlet
103 hollow box inlet
104 process chamber inlet
105 first gas distribution device
106 second inlet
107 second outlet
1052 gas flow orifice

What is claimed is:

1. A slot-die type gas distribution device for photovoltaic manufacturing, comprising a first gas distribution device, wherein the first gas distribution device is provided with a first inlet and a first outlet;

the first gas distribution device comprises a first gas distribution tube; the first inlet is arranged at a top of the first gas distribution tube, so that a flow direction of gas passing through the first inlet is perpendicular to a bottom surface of the first gas distribution tube, and the top of the first gas distribution tube is a highest position of the first gas distribution tube from the ground;

the first inlet is arranged at a center of the top of the first gas distribution tube;

wherein the first gas distribution tube is semicircular; and the first gas distribution tube includes a first rectangular plane and a first curved surface;

the first rectangular plane is located beneath the first curved surface and is parallel to the ground; and the first inlet is arranged on the first curved surface, and a height of the first inlet from the first rectangular plane is a radius of the first gas distribution tube.

2. The slot-die type gas distribution device for photovoltaic manufacturing according to claim 1, wherein a position of the first outlet is lower than that of the first inlet.

3. The slot-die type gas distribution device for photovoltaic manufacturing according to claim 1, wherein the first outlet is arranged along a length direction of the first gas distribution tube; a length of the first outlet is equal to that of the first gas distribution tube.

4. The slot-die type gas distribution device for photovoltaic manufacturing according to claim 1, wherein the first gas distribution device comprises m (m is greater than or equal to 2) first gas distribution tubes, which are communicated in sequence, and each two adjacent first gas distribution tubes are communicated, so as to implement gas distribution processes multiple times; the first inlet is arranged on the first gas distribution tube at a starting end, and the first outlet is arranged on the first gas distribution tube at a tail end.

5. The slot-die type gas distribution device for photovoltaic manufacturing according to claim 4, wherein the m first gas distribution tubes have the same size.

6. The slot-die type gas distribution device for photovoltaic manufacturing according to claim 1, wherein the first inlet is arranged at a center of the first curved surface of the first gas distribution tube.

7. The slot-die type gas distribution device for photovoltaic manufacturing according to claim 1, wherein the slot-die type gas distribution device further comprises a second gas distribution device, wherein the second gas distribution device is provided with a second inlet and a second outlet.

8. The slot-die type gas distribution device for photovoltaic manufacturing according to claim 7, wherein the second gas distribution device comprises a second gas distribution tube, the second outlet is arranged at a top of the second gas distribution tube, so that a flow direction of gas flowing out of the second outlet is perpendicular to a bottom surface of the second gas distribution tube, a position of the second inlet is lower than that of the second outlet, and the top of the second gas distribution tube is a highest position of the second gas distribution tube from the ground; and the second inlet is arranged along a length direction of the second gas distribution tube and has a length equal to that of the second gas distribution tube.

9. The slot-die type gas distribution device for photovoltaic manufacturing according to claim 8, wherein a height of the second inlet is greater than that of the first outlet.

10. The slot-die type gas distribution device for photovoltaic manufacturing according to claim 9, wherein the second gas distribution tube is semicircular or tetragonal.

11. The slot-die type gas distribution device for photovoltaic manufacturing according to claim 10, wherein when the second gas distribution tube is semicircular and includes a second rectangular plane and a second curved surface, the second rectangular plane of the second gas distribution tube is located beneath the second curved surface of the second gas distribution tube, and the second rectangular plane of the second gas distribution device is parallel to the ground;

the second inlet is arranged on the second curved surface of the second gas distribution tube, and a height of the second inlet from the second rectangular plane of the second gas distribution tube is less than a radius of the second gas distribution tube;

the second outlet is arranged on the second curved surface of the second gas distribution tube, and a height of the second outlet from the second rectangular plane of the second gas distribution tube is the radius of the second gas distribution tube.

* * * * *